(12) United States Patent
Song et al.

(10) Patent No.: US 11,765,945 B2
(45) Date of Patent: Sep. 19, 2023

(54) DISPLAY DEVICE HAVING A BLACK MATRIX

(71) Applicant: Samsung Display Co., Ltd., Yongin-si (KR)

(72) Inventors: Seungmin Song, Yongin-si (KR); Seunghwan Cho, Yongin-si (KR); Jonghyun Choi, Yongin-si (KR); Taewoo Kim, Yongin-si (KR); Sanghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 156 days.

(21) Appl. No.: 16/851,019

(22) Filed: Apr. 16, 2020

(65) Prior Publication Data

US 2020/0381502 A1    Dec. 3, 2020

(30) Foreign Application Priority Data

May 27, 2019    (KR) .......................... 10-2019-0062052

(51) Int. Cl.
*H01L 27/32*    (2006.01)
*H01L 27/14*    (2006.01)
(Continued)

(52) U.S. Cl.
CPC ...... *H01L 27/3272* (2013.01); *H01L 51/5246* (2013.01); *H01L 51/5253* (2013.01);
(Continued)

(58) Field of Classification Search
CPC ............. H01L 27/3272; H01L 27/3248; H01L 51/5245; H01L 51/5253; H01L 51/5275; H01L 51/5287; H01L 51/5293; H01L 51/5296; H01L 51/5218; H01L 51/5234; H01L 33/56; H01L 33/52; H01L 33/42; H01L 33/44; H01L 33/46; H01L 27/323; H01L 27/14678; H01L 27/322; H01L 27/3297; H01L 27/3211; H01L 27/3213; H01L 27/3265; H01L 27/3276; H01L 51/502; H01L 51/5246; H01L 51/5046;
(Continued)

(56) References Cited

U.S. PATENT DOCUMENTS 6,559,595 B1 * 5/2003 Inoue ................ G02F 1/133345
   313/506
8,120,640 B2    2/2012 Mikami
(Continued)

FOREIGN PATENT DOCUMENTS

CN      108769296 A    11/2018
EP      2447766 A1    5/2012
(Continued)

*Primary Examiner* — Ida M Soward
(74) *Attorney, Agent, or Firm* — Lewis Roca Rothgerber Christie LLP

(57) ABSTRACT

A display device includes a window, a display panel arranged below the window and including a display area and a peripheral area outside the display area; and a component arranged below the display panel and at least partially overlapping the peripheral area, wherein a black matrix is arranged on a bottom surface of the window in correspondence with an area in the peripheral area other than an area where the component is located.

20 Claims, 19 Drawing Sheets

(51) Int. Cl.

| | |
|---|---|
| *H01L 51/50* | (2006.01) |
| *H01L 51/52* | (2006.01) |
| *H01L 33/56* | (2010.01) |
| *H01L 33/52* | (2010.01) |
| *H01L 33/42* | (2010.01) |
| *H01L 33/44* | (2010.01) |
| *H01L 33/46* | (2010.01) |
| *G02F 1/13* | (2006.01) |
| G02F 1/1333 | (2006.01) |
| G02F 1/1335 | (2006.01) |
| H01L 27/146 | (2006.01) |

(52) U.S. Cl.
CPC .. *G02F 1/133331* (2021.01); *G02F 1/133528* (2013.01); *G09G 2300/0408* (2013.01); *G09G 2300/0804* (2013.01); *H01L 27/14678* (2013.01); *H01L 27/322* (2013.01); *H01L 27/323* (2013.01); *H01L 27/3211* (2013.01); *H01L 27/3213* (2013.01); *H01L 27/3248* (2013.01); *H01L 27/3265* (2013.01); *H01L 27/3276* (2013.01); *H01L 33/42* (2013.01); *H01L 33/44* (2013.01); *H01L 33/46* (2013.01); *H01L 33/52* (2013.01); *H01L 33/56* (2013.01); *H01L 51/502* (2013.01); *H01L 51/5056* (2013.01); *H01L 51/5088* (2013.01); *H01L 51/5218* (2013.01); *H01L 51/5234* (2013.01); *H01L 51/5275* (2013.01); *H01L 51/5287* (2013.01); *H01L 51/5293* (2013.01); *H01L 51/5296* (2013.01); *H01L 2251/301* (2013.01)

(58) Field of Classification Search
CPC ........... H01L 51/5088; H01L 2251/301; G02F 1/136209; G02F 1/1335; G02F 1/133512; G02F 1/133331; G02F 1/133528; G02F 2001/133357; G09G 2300/0408; G09G 2300/0804

See application file for complete search history.

(56) References Cited

U.S. PATENT DOCUMENTS

| | | | | |
|---|---|---|---|---|
| 8,487,892 B2* | 7/2013 | Kang | .................... | G06F 3/0443 345/173 |
| 8,717,513 B2 | 5/2014 | Park et al. | | |
| 9,837,479 B2* | 12/2017 | Song | .................... | H01L 27/3272 |
| 10,334,148 B2* | 6/2019 | Kwak | .................... | G06F 1/1637 |
| 10,402,019 B2* | 9/2019 | Jo | ............................ | G06F 3/041 |
| 10,551,698 B2* | 2/2020 | Koide | ................ | G02F 1/13454 |
| 10,860,124 B2* | 12/2020 | Jeong | .................... | G06F 3/0416 |
| 2013/0176512 A1* | 7/2013 | Posner | .................. | G02F 1/1333 349/33 |
| 2013/0258234 A1* | 10/2013 | Park | ....................... | G02F 1/1339 349/58 |
| 2015/0380474 A1* | 12/2015 | Lee | ..................... | H01L 51/5262 257/40 |
| 2016/0195965 A1* | 7/2016 | Kim | ....................... | G09G 5/003 345/173 |
| 2016/0241760 A1 | 8/2016 | Law | | |
| 2016/0266690 A1* | 9/2016 | Ahn | ......................... | G06F 1/16 |
| 2016/0306488 A1* | 10/2016 | Kim | ....................... | G06F 1/1643 |
| 2017/0242543 A1* | 8/2017 | Chan | ..................... | G06F 3/0447 |
| 2017/0287992 A1* | 10/2017 | Kwak | .................... | G06F 1/1686 |
| 2017/0293067 A1* | 10/2017 | Watanabe | ............ | G02B 6/0088 |
| 2017/0372114 A1* | 12/2017 | Cho | ....................... | G06F 1/1626 |
| 2018/0157362 A1* | 6/2018 | Kim | .................. | G02F 1/133528 |
| 2018/0190710 A1 | 7/2018 | Ryu et al. | | |
| 2019/0025957 A1* | 1/2019 | Lee | ....................... | G06F 3/0445 |
| 2019/0057238 A1* | 2/2019 | Hyun | ................ | H01L 27/14678 |
| 2019/0206898 A1* | 7/2019 | Baek | ..................... | H01L 27/124 |
| 2019/0214595 A1* | 7/2019 | Park | ..................... | H01L 27/323 |
| 2019/0214601 A1* | 7/2019 | Park | ..................... | H01L 27/326 |
| 2019/0293484 A1 | 9/2019 | Zhang | | |
| 2019/0355930 A1* | 11/2019 | Lee | .................... | H01L 51/5256 |
| 2019/0384121 A1* | 12/2019 | Nishiwaki | ......... | G02F 1/133512 |
| 2019/0393444 A1* | 12/2019 | Nam | ..................... | H01L 27/326 |
| 2020/0044006 A1* | 2/2020 | Lee | .................... | H01L 27/3276 |
| 2020/0110495 A1* | 4/2020 | Han | ..................... | H01L 27/3276 |
| 2020/0117037 A1* | 4/2020 | Koide | .................. | G06F 3/0416 |
| 2020/0119304 A1* | 4/2020 | Choi | ....................... | H01L 51/52 |
| 2020/0174301 A1* | 6/2020 | Tien | ..................... | H04N 5/2257 |
| 2020/0174307 A1* | 6/2020 | Chang | ................. | G02F 1/133514 |
| 2020/0186688 A1* | 6/2020 | Chen | .................. | G02F 1/133528 |
| 2021/0343824 A1* | 11/2021 | Kim | .................... | H01L 27/3276 |

FOREIGN PATENT DOCUMENTS

| | | |
|---|---|---|
| EP | 2565603 A2 | 3/2013 |
| EP | 3176771 A2 | 6/2017 |
| JP | 2008-118589 A | 5/2008 |
| KR | 10-2015-0012483 A | 2/2015 |
| KR | 10-2017-0111827 A | 10/2017 |
| KR | 10-1813459 B1 | 1/2018 |

\* cited by examiner

DISPLAY DEVICE HAVING A BLACK MATRIX

CROSS-REFERENCE TO RELATED APPLICATION

This application claims priority to and the benefit of Korean Patent Application No. 10-2019-0062052, filed on May 27, 2019, in the Korean Intellectual Property Office, the disclosure of which is incorporated herein in its entirety by reference.

BACKGROUND

1. Field

One or more embodiments relate to a display device, and more particularly, to a display device in which a high-quality image can be realized.

2. Description of the Related Art

Recently, the usage (e.g., features) of display devices has been diversified. In addition, as the display devices become thinner and lighter, the range of usage of the display devices is expanding.

The number of various functions associated with or linked to a display device has increased while the area occupied by a display area of the display device has been enlarged. As a method to add various functions thereto while enlarging the display area, a display device in which various elements (e.g., modules or accessories) may be arranged in the display area has been studied.

SUMMARY

Aspects according to one or more embodiments of the present disclosure are directed toward a display panel having an area capable of arranging various types of components (e.g., an area capable of accommodating various modules or accessories) and a display device including the display panel. However, the aspects are exemplary and do not limit the scope of the present disclosure.

Additional aspects will be set forth in part in the description which follows and, in part, will be apparent from the description, or may be learned by practice of the presented embodiments of the disclosure.

According to one or more embodiments, a display device includes a window, a display panel below the window and including a display area and a peripheral area outside the display area; and a component (e.g., module or accessory) below the display panel and at least partially overlapping the peripheral area; wherein a black matrix is on a bottom surface of the window in correspondence with an area outside where the component is located in the peripheral area.

In an embodiment, the display panel may include a substrate; an insulating layer above the substrate in the display area and the peripheral area, the insulating layer having a first opening in the peripheral area; a pixel electrode above the insulating layer in the display area; a first conductive layer above the insulating layer in the peripheral area and covering the first opening; an intermediate layer on the pixel electrode; and an opposite electrode covering the intermediate layer and contacting the first conductive layer.

In an embodiment, the component may not overlap the opposite electrode in the peripheral area.

In an embodiment, the component may at least partially overlap the opposite electrode in the peripheral area.

In an embodiment, the display panel may further include a second conductive layer in the peripheral area, outside the first opening, and below the insulating layer, wherein the insulating layer may include a second opening exposing the second conductive layer, and the first conductive layer contacts the second conductive layer in the second opening.

In an embodiment, the display panel may further include a dam above the second conductive layer.

In an embodiment, the component may at least partially overlap the dam.

In an embodiment, the display panel may further include an encapsulation layer covering the display area and including at least one organic layer and at least one inorganic layer.

In an embodiment, the at least one organic layer of the encapsulation may be inside the dam, and the at least one inorganic layer of the encapsulation layer may extend outside of the dam. The component may not overlap the at least one organic layer of the encapsulation layer and may overlap the at least one inorganic layer of the encapsulation layer.

In an embodiment, the component may overlap the at least one organic layer and the at least one inorganic layer.

In an embodiment, the component may overlap the peripheral area located in a corner of the display panel.

In an embodiment, the window may include a portion extending outside the peripheral area of the display panel, and at least a portion of the component may overlap the extended portion of the window.

In an embodiment, in the peripheral area of the display panel, a first area where the component is located may be different in light transmittance from that of a second area outside the first area.

According to one or more embodiments, a display device includes a window; a display panel below the window and including a display area and a peripheral area around the display area; and a component (e.g., module or accessory) below the display panel and at least partially overlapping the display area, wherein a black matrix is on a bottom surface of the window in correspondence with an area outside where the component is located in the peripheral area.

In an embodiment, the display device may further include a light-inducing member at least partially overlapping the peripheral area and to transmit external light penetrating the peripheral area to the component.

In an embodiment, the light-inducing member may include an optical fiber.

In an embodiment, the display panel may include a substrate; an insulating layer above the substrate in the display area and the peripheral area, the insulating layer having a first opening in the peripheral area; a display element above an insulating layer in the display area and including a pixel electrode, an intermediate layer, and an opposite electrode; and a first conductive layer above the insulating layer in the peripheral area and covering the first opening; wherein the opposite electrode may extend to the peripheral area and contacts the first conductive layer.

In an embodiment, the component may at least partially overlap the first opening in the peripheral area.

In an embodiment, the component may not overlap the display element in the display area.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
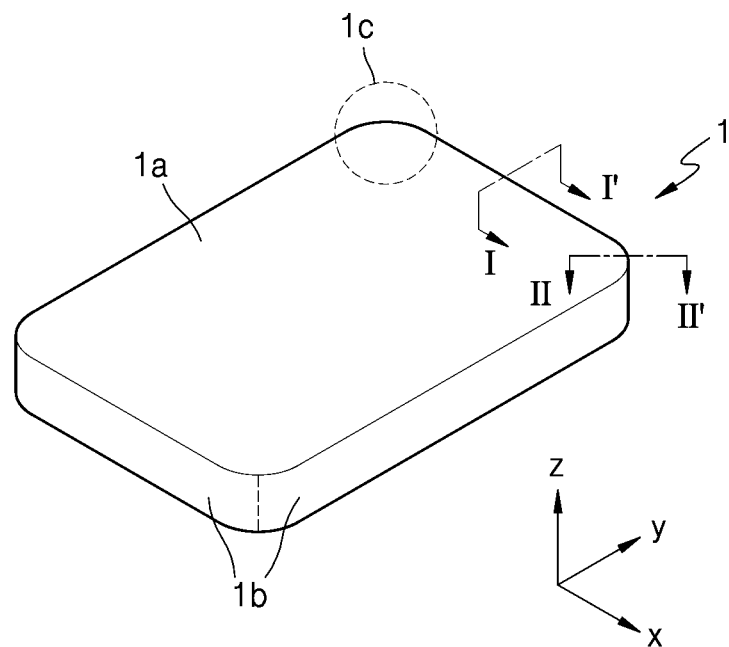
FIG. 1 is a schematic perspective view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the embodiments of the present disclosure will now be described more fully with reference to the accompanying drawings. Like reference numerals in the drawings denote like elements, and thus their description will not be repeated.

While terms such as "first," "second," etc., may be used to describe various elements, such elements should not be limited to the above terms.

An expression used in the singular encompasses the expression of the plural, unless it has a clearly different meaning in the context.

In the present disclosure, it is to be understood that the terms such as "including," "having," and "comprising" are intended to indicate the existence of the features or elements, and are not intended to preclude the possibility that one or more other features or elements may exist or may be added.

It will be understood that when a layer, region, or element is referred to as being "formed on" another layer, region, or element, it can be directly or indirectly formed on the other layer, region, or element, for example, or intervening layer(s), region(s), or component(s) may be present.

Sizes of elements in the drawings may be exaggerated for convenience of explanation. In other words, because sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed at substantially the same time or performed in an order opposite to the described order.

In the present disclosure, the phrase "A and/or B" refers to A, B, or A and B. In addition, in the present disclosure, the phrase "at least one of A and B" refers to A, B, or A and B.

In the following embodiments, it will be understood that when a layer, region, or element is referred to as being "connected to" another layer, region, or element, it can be directly or indirectly connected to the other layer, region, or element. For example, it will be understood that when a layer, region, or element is referred to as being "connected to" another layer, region, or element, it can be not only directly electrically connected to the other layer, region, or element, but also indirectly electrically connected to the other layer, region, or element with other layer, region, or element interposed between.

In the present disclosure, it will be understood that when a wire is referred to as "extending in a first direction or a second direction", it can not only extend in a linear shape, but also extend in the first direction or the second direction in a zigzag or curved shape.

In addition, in the present disclosure, the term "plan view" indicates that a portion of a target object is seen from the above, and the term "cross-sectional view" indicates that a portion of a target object is vertically cut and the cross-section is viewed from the side. In the present disclosure, the term "overlapping" includes overlapping in a plan view and/or in a cross-sectional view.

Figure 2:
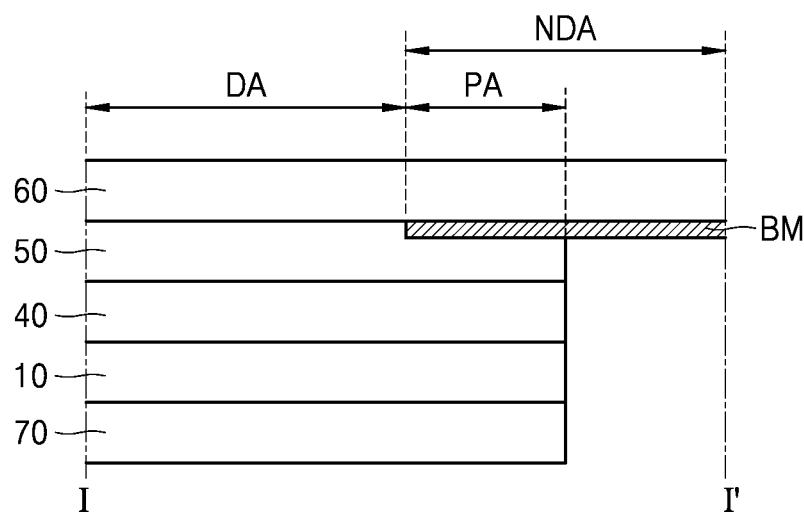
FIG. 2 is a schematic cross-sectional view of a portion of a display device according to an embodiment, taken along the line I-I' in FIG. 1.

FIG. 1 is a schematic perspective view of a display device 1 according to an embodiment. FIG. 2 is a schematic cross-sectional view of a portion of the display device 1 according to an embodiment, taken along the line I-I' in FIG. 1. FIGS. 3A to 3E are schematic cross-sectional views according to respective embodiments of a portion of the display device 1 taken along the line II-II' in FIG. 1.

Hereinafter, the display device 1 according to an embodiment is described as an organic light-emitting display device, but the display device of the present disclosure is not limited thereto. In another embodiment, the display device 1 may be a display device such as an inorganic light-emitting display device (inorganic EL display device) or a quantum dot light-emitting display device. For example, an emission layer of a display element in the display device 1 may include an organic material, an inorganic material, a quantum dot, an organic material and a quantum dot, or an inorganic material and a quantum dot.

Referring to FIG. 1, the display device 1 according to an embodiment may include a front surface 1a and four side surfaces 1b extending from the front surface 1a. Four corner portions 1c of the front surface 1a may have a round shape. The corner portions 1c may be regions where adjacent edges (e.g., upper and lower edges, and left and right edges) of the front surface 1a meet with each other. The front surface 1a may be substantially flat. At least one of the four side surfaces 1b may include a curved area and/or a flat area bent from the front surface 1a. A length of a pair of side surfaces 1b facing each other and extending in a first direction (e.g., x direction) may be less than a length of a pair of side surfaces 1b facing each other and extending in a second direction (e.g., y direction).

The display device 1 (e.g., the front surface 1a) may include a display area displaying an image and a non-display area outside the display area. The at least one of the four side surfaces 1b may include the display area. The four side surfaces 1b may include the non-display area. The display area of the display device 1 may be a display area DA of a display panel 10 shown in FIG. 2 (to be described below).

FIG. 2 is a cross-sectional view representing upper and lower edge areas, and left and right edge areas of the front surface 1a of the display device 1.

Referring to FIG. 2, the display device 1 may include the display panel 10, an input sensing layer 40, and an optical functional layer 50, which are sequentially stacked in a third direction (e.g., z-direction) and covered by a window 60. A protective film 70 may be attached to a bottom surface of the display panel 10 to protect the display panel 10. The display device 1 may be of various suitable types of electronic devices (e.g., various suitable kinds of electronic devices) such as a mobile phone, a laptop computer, or a smart watch.

The window 60 may include a display area DA and a non-display area NDA respectively corresponding to the display area and the non-display area of the display device 1. The non-display area NDA of the window 60 may be referred to as an area from an edge of the window 60 to a boundary between a display area DA and a peripheral area PA of the display panel 10. Each of the display panel 10, the input sensing layer 40, and the optical functional layer 50 may include the display area DA corresponding to the display area of the display device 1 and the peripheral area PA corresponding to the non-display area of the display device 1. The protective film 70 may be attached to a position corresponding to the display area DA and the peripheral area PA of the display panel 10. The peripheral area PA of the display panel 10, the input sensing layer 40, and/or the optical functional layer 50 may be visible to a user viewing the front surface 1a of the display device 1. However, the embodiments are not limited thereto. The peripheral area PA of the display panel 10, the input sensing layer 40, and/or the optical functional layer 50 may be bent (e.g., bent away from the front surface) and not be visible to the user viewing the front surface 1a of the display device 1. The peripheral area PA of the display panel 10 may be located in some (e.g., one or more) of the corner portions 1c of the display device 1, as described below with reference to FIGS. 3A to 3E.

The display panel 10 may display an image. The display panel 10 may include the display area DA and the peripheral area PA outside the display area DA. The peripheral area PA may be a non-display area which does not display an image. The display panel 10 may include pixels arranged in the display area DA. The pixels may include a display element and a pixel circuit connected to the display element. The display element may include an organic light-emitting diode, a quantum dot organic light-emitting diode, or the like.

The input sensing layer 40 may obtain coordinate information according to an external input, for example, a touch event. The input sensing layer 40 may include a sensing electrode (or touch electrode) and a trace line connected to the sensing electrode. The input sensing layer 40 may be arranged on the display panel 10. The input sensing layer 40 may sense an external input in a mutual-capacitance method and/or a self-capacitance method.

The input sensing layer 40 may be formed directly on the display panel 10 or formed separately and then bonded to the display panel 10 through an adhesive layer (such as an optical clear adhesive). For example, the input sensing layer 40 may be formed continuously after a process of forming the display panel 10. In this case, the input sensing layer 40 may be a portion of the display panel 10 and the adhesive layer may not be included between the input sensing layer 40 and the display panel 10. Although FIG. 2 illustrates that the input sensing layer 40 is between the display panel 10 and the optical functional layer 50, the input sensing layer 40 may be arranged above (e.g., closer to the window 60 than) the optical functional layer 50 in another embodiment.

The optical functional layer 50 may include an anti-reflection layer. The anti-reflection layer may reduce the reflectance of light incident from the outside (external light) toward the display panel 10 through the window 60. The anti-reflection layer may include a retarder and a polarizer. The retarder may be a film type (e.g., a film retarder) or a liquid crystal coating type (e.g., a liquid crystal coating retarder) and may include a λ/2 retarder and/or a λ/4 retarder. The polarizer may also be a film type (e.g., a film polarizer) or a liquid crystal coating type (e.g., a liquid crystal coating polarizer). The film-type polarizer may include a stretch-type synthetic resin film (e.g., a stretched synthetic resin film), and the liquid crystal coating-type polarizer may include liquid crystals in a certain arrangement. The retarder and the polarizer may further include a protective film. The protective film of the retarder and the polarizer may be defined as a base layer of the anti-reflection layer.

In another embodiment, the anti-reflection layer may include a black matrix and color filters. The color filters may be arranged considering the color of light emitted from each of the pixels of the display panel 10. Each of the color filters may include red, green, or blue pigments or dyes. Alternatively, each of the color filters may further include quantum dots in addition to the pigments or dyes stated above. Alternatively, some of the color filters may not include the pigments or dyes stated above and may include scattering particles such as titanium oxide.

In another embodiment, the anti-reflection layer may include a destructive interference structure. The destructive interference structure may include a first reflective layer and a second reflective layer arranged on different layers. First reflected light and second reflected light respectively reflected from the first reflective layer and the second reflective layer may interfere destructively, and thus, the reflectance of external light may be reduced.

The optical functional layer 50 may include a lens layer. The lens layer may improve the light output efficiency of the light emitted from the display panel 10 or reduce color deviation. The lens layer may include a layer having a concave or convex lens shape and/or may include a plurality of layers having different refractive indices. The optical functional layer 50 may include both of the anti-reflection layer and the lens layer, or may include one of the anti-reflection layer and the lens layer.

In an embodiment, the optical functional layer 50 may be formed continuously after a process of forming the display panel 10 and/or the input sensing layer 40. In this case, an adhesive layer may not be included between the optical functional layer 50, the display panel 10, and/or the input sensing layer 40.

The window 60 may transmit light emitted from the display panel 10 to the outside. The window 60 may transmit external light into the display device 1. The window 60 may include a material having excellent light transmittance, heat resistance, chemical resistance, mechanical strength, and/or the like. For example, the window 60 may include a transparent film including polyethylene terephthalate and/or the like, and/or a glass substrate. The window 60 may include a plastic substrate including poly(methyl methacrylate), polyamide, polyimide, polypropylene, polyurethane, and/or the like.

A black matrix BM in the non-display area NDA may be arranged on a bottom surface of the window 60. The black matrix BM may be formed as a colored organic layer, for example, by a coating method. In an embodiment, an optical clear adhesive and/or the like may be between the window 60 and the optical functional layer 50.

As shown in FIGS. 3A to 3E, the display device 1 may further include a component (e.g., a module or accessory) 20 configured to add various functions to the display device 1. Hereinafter, an area where the component 20 is located in the display device 1 is referred to as a component area CA (for example, a sensor area, a camera area, a speaker area, and/or the like). In an embodiment, the component area CA may be included in the non-display area NDA of the display device 1. In another embodiment, the component area CA may be included in the display area DA of the display device 1.

The component 20 may include an electronic element. For example, the component 20 may include an electronic element that utilizes light and/or sound. For example, the electronic element may include a sensor outputting and/or receiving light, such as an infrared sensor, a camera capturing an image by receiving light, a sensor outputting and sensing light or sound to measure a distance and/or recognize a fingerprint, a small lamp outputting light, a speaker outputting sound, and/or the like. The electronic element utilizing light may utilize light of various suitable wavelengths such as visible light, infrared light, ultraviolet light, and/or the like. The component 20 may include element(s) associated with a function of the display panel 10 as described above and/or may include elements such as accessories that increase aesthetics of the display panel 10.

In an embodiment, the component area CA may be a transmission area through which light and/or sound output from the electronic element to the outside and/or from the outside toward the electronic element may pass. For example, the component area CA may be an area corresponding to an optical unit including a lens unit and an image sensor in a camera, and may not include an area corresponding to a processor connected to the optical unit, hardware or software elements connected to the processor, and modules accommodating the processor and the hardware or software elements.

In one embodiment, the display device 1 may further include a housing. The housing may store the display panel 10, the input sensing layer 40, the optical functional layer 50, the window 60, and the component 20.

FIGS. 3A to 3E are cross-sectional views of the corner portion 1c according to respective embodiments of the front surface 1a of the display device 1.

Figure 3A:
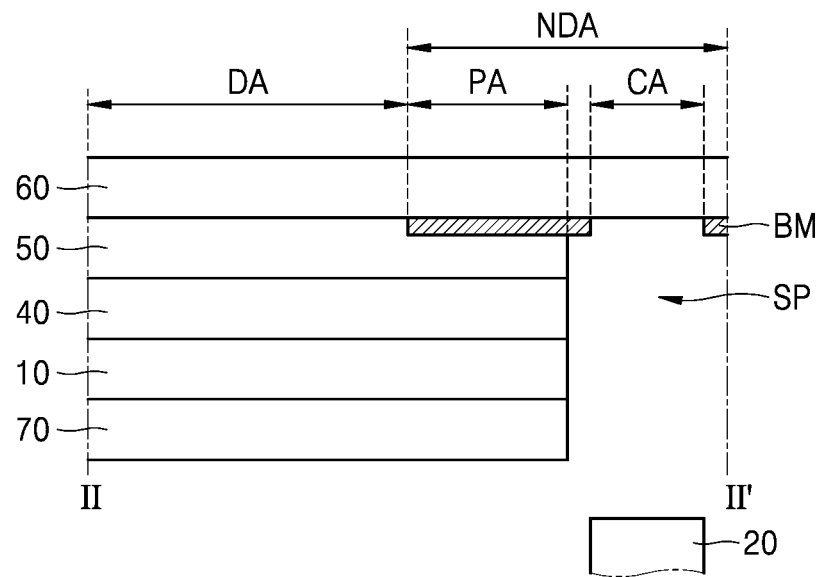
FIGS. 3A to 3E are schematic cross-sectional views according to respective embodiments of a portion of a display device taken along the line II-II' in FIG. 1.

Referring to FIG. 3A, the component area CA may be included in the non-display area NDA of the window 60 and may be outside the peripheral area PA of the display panel 10. In other words, the component area CA may not overlap the peripheral area PA of the display panel 10. The black matrix BM arranged on the bottom surface of the window 60 may be removed in an area corresponding to the component area CA. The component 20 may be arranged in a position corresponding to the component area CA and may be arranged below the display panel 10. In another embodiment, the component 20 may be inserted into a space SP defined by the window 60 and the housing.

Figure 3B:
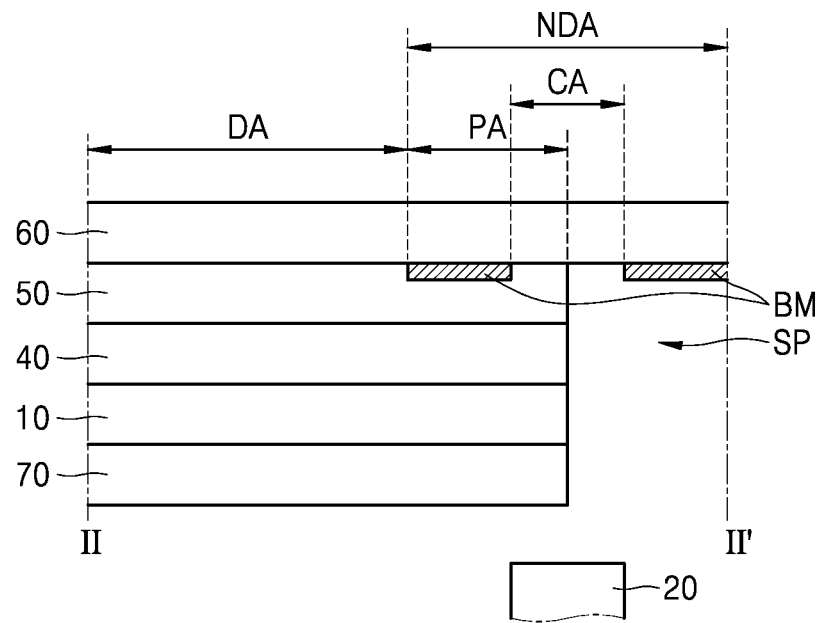

Referring to FIG. 3B, the component area CA may be included in the non-display area NDA of the window 60 and a portion of the component area CA may be included in the peripheral area PA of the display panel 10. In other words, the component area CA may partially overlap the peripheral area PA of the display panel 10. The black matrix BM arranged on the bottom surface of the window 60 may be removed from an area corresponding to the component area CA. The component 20 may be arranged in a position corresponding to the component area CA and may be arranged below the display panel 10.

Figure 3C:
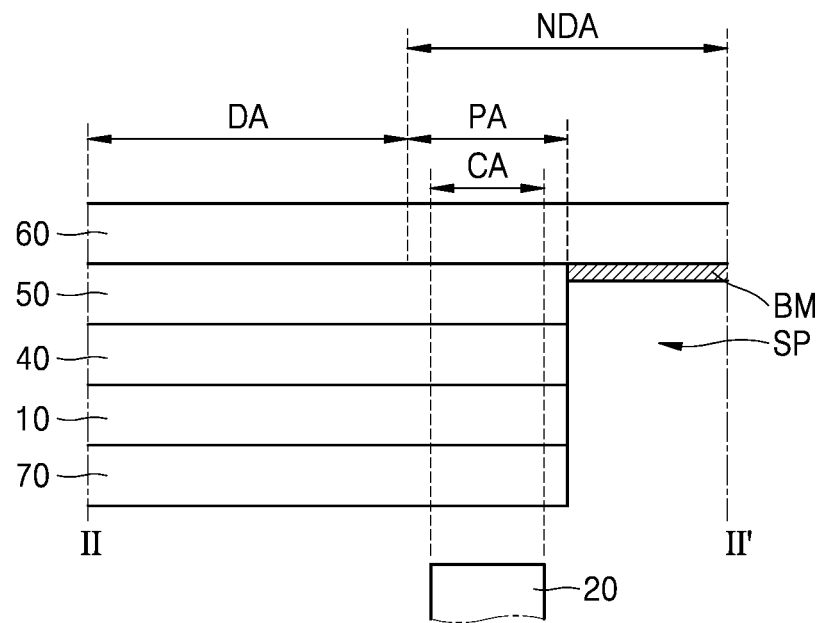

Referring to FIG. 3C, the component area CA may be included in the non-display area NDA of the window 60 and may be included in the peripheral area PA of the display panel 10. In other words, the entire component area CA may overlap the peripheral area PA of the display panel 10. The black matrix BM arranged on the bottom surface of the window 60 may be removed from an area corresponding to the component area CA. The component 20 may be arranged in a position corresponding to the component area CA and may be arranged below the display panel 10.

Figure 3D:
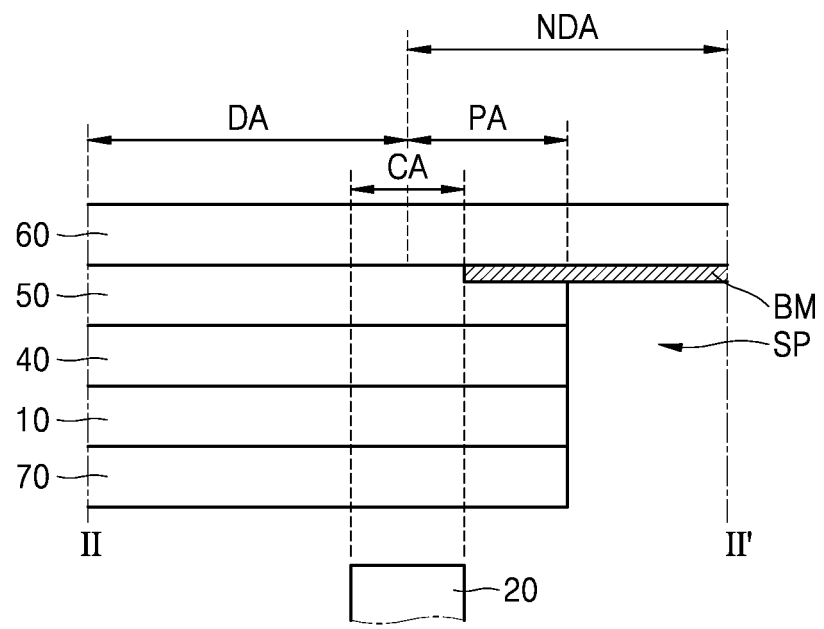

Referring to FIG. 3D, the component area CA may be included in the display area DA and the non-display area NDA of the window 60. In other words, a portion of the component area CA may overlap the display area DA of the display panel 10, and a portion of the component area CA may overlap the peripheral area PA of the display panel 10. The black matrix BM arranged on the bottom surface of the window 60 may be removed from an area corresponding to the component area CA. The component 20 may be arranged in a position corresponding to the component area CA and may be arranged below the display panel 10.

Figure 3E:
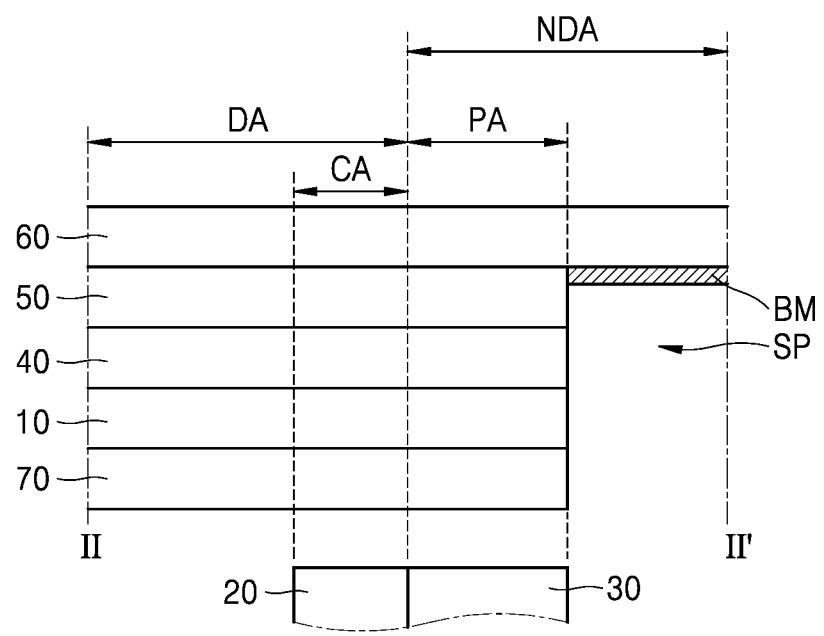

Referring to FIG. 3E, the component area CA may be a portion of the display area DA of the display panel 10. In other words, the component area CA may overlap the display area DA of the display panel 10. The component 20 may be arranged in a position corresponding to the component area CA and may be arranged below the display panel 10. The component 20 may be connected to a light-inducing member 30 located in the peripheral area PA of the display panel 10 and/or outside the peripheral area PA of the display panel 10. The black matrix BM in the non-display area NDA of the window 60 may be removed from an area corresponding to an area where the light-inducing member 30 is arranged. The light-inducing member 30 may transmit external light to the component 20 and/or transfer (guide) light output from the component 20 to the outside. The light-inducing member 30 may include optical fiber.

In the embodiments of FIGS. 3A to 3E, the light transmittance of the component area CA may be 50% or more. The light transmittance of the component area CA at which the component 20 operates may be different according to a type (e.g., kind) of the component 20. For example, the light transmittance required for a sensor utilized for iris recognition may differ from the light transmittance required for a proximity light infrared (IR) sensor. The light transmittance of the component area CA may differ depending on a position of the component area CA and a component 20 may be appropriately arranged according to the light transmittance of the component area CA. For example, a component 20 requiring high light transmittance may be arranged in the component area CA according to the embodiment of FIG. 3A.

Figure 4:
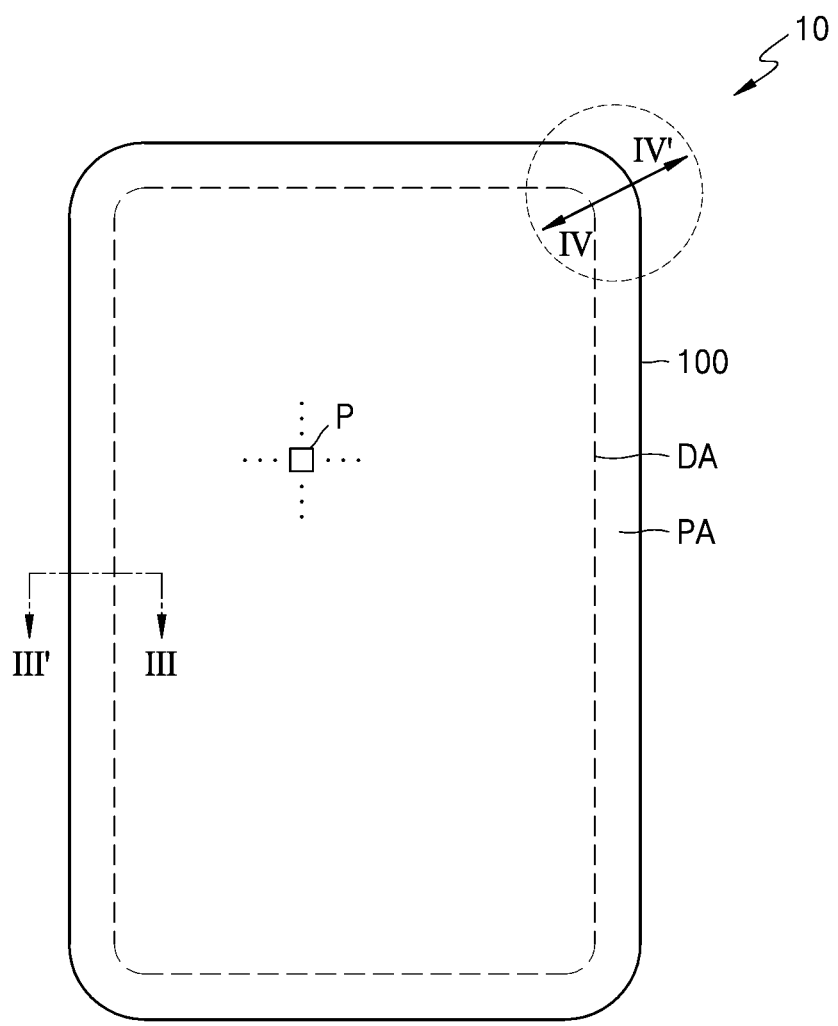
FIG. 4 is a schematic plan view of a display panel according to an embodiment.
Figure 5:
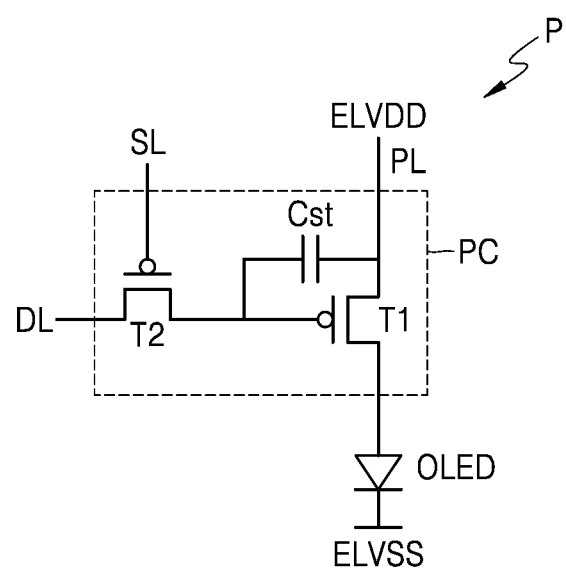
FIG. 5 is an equivalent circuit diagram of a pixel arranged in a display panel according to an embodiment.

FIG. 4 is a schematic plan view of the display panel 10 according to an embodiment. FIG. 5 is an equivalent circuit diagram of a pixel P arranged in a display panel according to an embodiment.

Referring to FIG. 4, the display panel 10 according to an embodiment may include the display area DA and the peripheral area PA outside the display area DA. FIG. 4 may be a view of a substrate 100 of the display panel 10. For example, the substrate 100 has the display area DA and the peripheral area PA.

The display panel 10 includes a plurality of pixels P arranged in the display area DA. As shown in FIG. 5, each pixel P includes a pixel circuit PC and an organic light-emitting diode OLED as a display element connected to the pixel circuit PC. The pixel circuit PC may include a first transistor T1, a second transistor T2, and a capacitor Cst. Each pixel P may emit, for example, red, green, blue, or white light from the organic light-emitting diode OLED. The first transistor T1 and the second transistor T2 may include thin-film transistors.

The second transistor T2 includes a switching transistor which may be connected to a scan line SL and a data line DL and transfer, to the first transistor T1, a data voltage input from the data line SL according to a switching voltage input from the scan line SL. The capacitor Cst may be connected to the second transistor T2 and a driving voltage line PL and store a voltage corresponding to a difference between a voltage received from the second transistor T2 and a first power supply voltage ELVDD supplied to the driving voltage line PL.

The first transistor T1 includes a driving transistor which may be connected to the driving voltage line PL and the capacitor Cst and may control a driving current flowing from the driving voltage line PL through the organic light-emitting diode OLED in accordance with a voltage value stored in the capacitor Cst. The organic light-emitting diode OLED may emit light having a certain brightness according to the driving current. An opposite electrode (e.g., cathode) of the organic light-emitting diode OLED may receive a second power supply voltage ELVSS.

Although FIG. 5 illustrates that the pixel circuit PC includes two transistors and one capacitor, the present disclosure is not limited thereto. The number of transistors and the number of capacitors may be variously changed according to the design of the pixel circuit PC.

A scan driver providing a scan signal to each pixel P, a data driver providing a data signal to each pixel P, a main power-supply wiring configured to provide the first power supply voltage ELVDD and the second power supply voltage ELVSS, and/or the like may be arranged in the peripheral area PA.

The substrate 100 may include at least one component area CA. In an embodiment, the at least one component area CA may be included in the peripheral area PA. In another embodiment, a portion of the at least one component area CA may be included in the display area DA.

Figure 6:
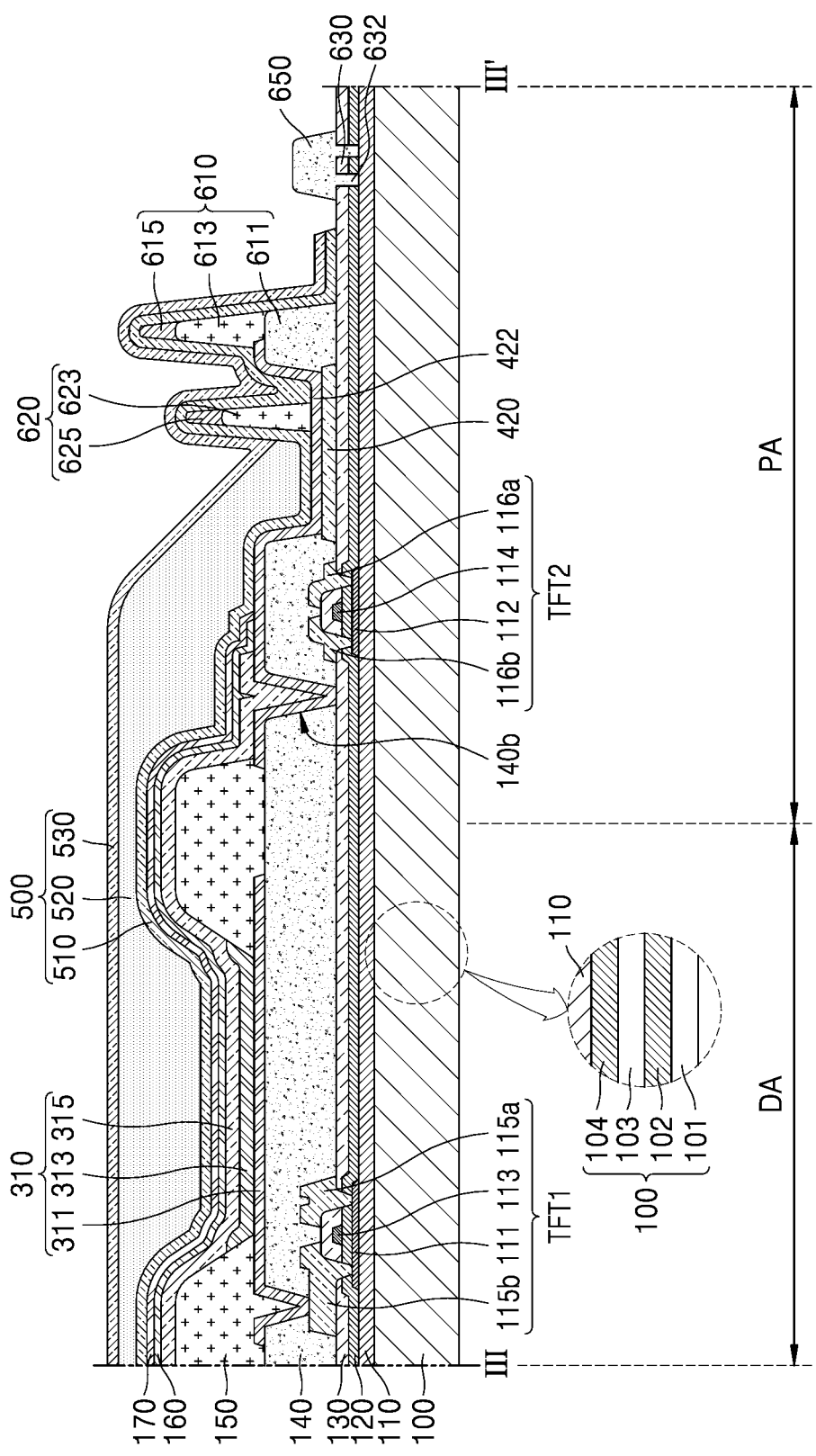
FIG. 6 is a schematic cross-sectional view of a portion of a display panel according to an embodiment, taken along the line III-III' in FIG. 4.

FIG. 6 is a schematic cross-sectional view of a portion of the display panel 10 according to an embodiment, taken along the line III-III' in FIG. 4.

FIG. 6 is a cross-sectional view of a portion of the four sides of the display panel 10 shown in FIG. 4. Referring to FIG. 6, the substrate 100 may include a glass material or a polymer resin. The substrate 100 may include multiple layers. For example, as shown in an enlarged view of FIG. 6, the substrate 100 may include a first base layer 101, a first barrier layer 102, a second base layer 103, and a second barrier layer 104.

Each of the first base layer 101 and the second base layer 103 may include a polymer resin. For example, the first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), and/or the like. The first base layer 101 and the second base layer 103 may include a transparent polymer resin.

The first barrier layer 102 and the second barrier layer 104 may be barriers preventing or reducing penetration of an external foreign substance and may include a single layer or multiple layers, each including an inorganic material such as silicon nitride, silicon oxide, and/or the like.

A buffer layer 110 may be arranged on the substrate 100 to prevent or substantially prevent impurities from penetrating into a semiconductor layer of a thin-film transistor. The buffer layer 110 may include an inorganic insulating material such as silicon nitride and/or silicon oxide, and may include a single layer or multiple layers.

A first thin-film transistor TFT1 and an organic light-emitting diode 310 electrically connected to the first thin-film transistor TFT1 may be arranged in the display area DA of the substrate 100. The organic light-emitting diode 310 may be electrically connected to the first thin-film transistor TFT1 through a pixel electrode 311 thereof which is electrically connected to the first thin-film transistor TFT1. The first thin-film transistor TFT1 may be the first transistor T1 in FIG. 5.

The first thin-film transistor TFT1 may include a semiconductor layer 111, a gate electrode 113, a source electrode 115a, and a drain electrode 115b. The semiconductor layer 111 may include amorphous silicon, polycrystalline silicon, and/or an organic semiconductor material. The gate electrode 113 may be arranged above the semiconductor layer 111. The gate electrode 113 may include, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may include a single-layer structure or a multilayer structure.

A gate insulating layer 120 may be between the semiconductor layer 111 and the gate electrode 113 to insulate between the semiconductor layer 111 and the gate electrode 113. The gate insulating layer 120 may include an inorganic material such as silicon oxide, silicon nitride, and/or silicon oxynitride. An interlayer insulating layer 130 may be arranged on the gate electrode 113 and may include a single-layer structure or a multilayer structure, each including an inorganic material such as silicon oxide, silicon nitride, silicon oxynitride, and/or the like.

The source electrode 115a and the drain electrode 115b are arranged on the interlayer insulating layer 130. Each of the source electrode 115a and the drain electrode 115b may be electrically connected to the semiconductor layer 111 through a contact hole formed in the interlayer insulating layer 130 and the gate insulating layer 120. The source electrode 115a and the drain electrode 115b may include, considering conductivity and/or the like, for example, Al, Pt, Pd, Ag, Mg, Au, Ni, Nd, Ir, Cr, Li, Ca, Mo, Ti, W, and/or Cu, and may have a single-layer structure or a multilayer structure.

In an embodiment, a protective film covering the first thin-film transistor TFT1 to protect the first thin-film transistor TFT1 may be provided. The protective film may include an inorganic material such as silicon oxide, silicon nitride, silicon oxynitride, and/or the like. The protective film may include a single layer or a multilayer structure.

A planarization layer 140 may be arranged above the protective film. The planarization layer 140 may substantially planarize an upper portion of the protective film covering the first thin-film transistor TFT1. The planarization layer 140 may include a general commercial polymer (such as poly(methyl methacrylate) (PMMA) and/or polystyrene (PS)), a polymer derivative having a phenol group, and/or an organic insulating material (such as an acrylic polymer, an imide polymer, an aryl ether polymer, an amide polymer, a fluorine polymer, a p-xylene polymer, a vinyl alcohol polymer, and/or a blend thereof). Although FIG. 6 illustrates that the planarization layer 140 as a single layer, various suitable modifications may be made; for example, the planarization layer 140 may be a multilayer structure. The display panel 10 may include both the protective film and the planarization layer 140, or may only include the planarization layer 140 as needed.

In the display area DA of the substrate 100, the organic light-emitting diode 310 may be arranged on the planarization layer 140. The organic light-emitting diode 310 may include the pixel electrode 311, an opposite electrode 315, and an intermediate layer 313 between the pixel electrode 311 and the opposite electrode 315, and may include an emission layer.

The planarization layer 140 may include an opening exposing the source electrode 115a or the drain electrode 115b of the first thin-film transistor TFT1. The pixel electrode 311, which is in contact with the source electrode 115a or the drain electrode 115b through the opening (to thereby be electrically connected to the first thin-film transistor TFT1), may be arranged on the planarization layer 140. The pixel electrode 311 may include a semi-transparent electrode or a reflective electrode. When the pixel electrode 311 includes a semi-transparent electrode, the pixel electrode 311 may include, for example, indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 311 includes a reflective electrode, the pixel electrode 311 may include a reflective film (e.g., a reflective layer) including Ag, Mg, Al, Pt, Pd, Au, Ni, Nd, Ir, Cr, and/or a compound thereof, and a layer including ITO, IZO, ZnO, $In_2O_3$, IGO, and/or AZO. However, embodiments are not limited thereto. The pixel electrode 311 may include various suitable materials, the structure of the pixel electrode 311 may be a single layer or a multilayer, and various suitable modifications may be made.

A pixel defining layer 150 may be arranged on the planarization layer 140. The pixel defining layer 150 may define a pixel by having an opening corresponding to each of the pixels, that is, an opening exposing at least a central portion of the pixel electrode 311. In addition, the pixel defining layer 150 prevents or substantially prevents an arc and/or the like from being generated at an edge of the pixel electrode 311 by insulating or increasing a distance between an edge of the pixel electrode 311 and the opposite electrode 315 above the pixel electrode 311. The pixel defining layer 150 may include an organic material such as polyimide, hexamethyldisiloxane (HMDSO), and/or the like.

The intermediate layer 313 of the organic light-emitting diode 310 includes an emission layer. The emission layer may include a polymer and/or low-molecular-weight organic material which emits light of a certain color. In an embodiment, the intermediate layer 313 may include a first functional layer below the emission layer and/or a second functional layer above the emission layer. The first functional layer and/or the second functional layer may include an integrated layer (e.g., a continuous layer) over a plurality of pixel electrodes 311 or may include a patterned layer corresponding to each of the plurality of pixel electrodes 311.

The first functional layer may include a single layer or multiple layers. For example, when the first functional layer includes a polymer material, the first functional layer may include a hole transport layer (HTL) having a single-layer structure and may include poly-(3,4)-ethylene-dihydroxy thiophene (PEDOT) and/or polyaniline (PANI). When the first functional layer includes a low-molecular-weight material, the first functional layer may include a hole injection layer (HIL) and an HTL.

The second functional layer may be omitted. For example, when the first functional layer and the emission layer include a polymer material, the second functional layer is preferably formed to improve the characteristics of the organic light-emitting diode 310. The second functional layer may include a single layer or multiple layers. The second functional layer may include an electron transport layer (ETL) and/or an electron injection layer (EIL).

The opposite electrode 315 may be arranged over the display area DA and the peripheral area PA and may be formed as a single body with respect to a plurality of organic light-emitting diodes 310 to face the plurality of pixel electrodes 311. The opposite electrode 315 may include a semi-transparent electrode or a reflective electrode. When the opposite electrode 315 includes a semi-transparent electrode, the opposite electrode 315 may include a layer including a metal having a small work function, for example, Li, Ca, lithium fluoride (LiF)/Ca, LiF/Al, Ag, Mg, and/or a compound thereof, and may include a semi-transparent conductive layer of ITO, IZO, ZnO, $In_2O_3$, and/or the like. When the opposite electrode 315 includes a reflective electrode, the opposite electrode 315 may include a layer including Li, Ca, LiF/Ca, LiF/Al, Al, Ag, Mg, and/or a compound thereof. The structure and material of the opposite electrode 315 are not limited thereto and various suitable modifications may be made.

An electrode power-supply line 420 may be located in the peripheral area PA and may transfer a preset electrical signal to the opposite electrode 315. The electrode power-supply line 420 may be simultaneously or concurrently formed when forming various conductive layers in the display area DA by utilizing the same materials as those of the various conductive layers. FIG. 6 illustrates that the electrode power-supply line 420 is located on the interlayer insulating layer 130 in the peripheral area PA. In this case, when the source electrode 115a and the drain electrode 115b of the first thin-film transistor TFT1 in the display area DA are formed on the interlayer insulating layer 130, the electrode power-supply line 420 is also formed on the interlayer insulating layer 130 in the peripheral area PA by utilizing the same material as that of the source electrode 115a and the drain electrode 115b of the first thin-film transistor TFT1 in the display area DA. Accordingly, the electrode power-supply line 420 may have the same structure as the source electrode 115a and the drain electrode 115b. However, the present disclosure is not limited thereto. Various suitable modifications may be made. For example, when the gate electrode 113 is formed, the electrode power-supply line 420 may be formed on the gate insulating layer 120 by utilizing the same material as that of the gate electrode 113 at the same time (e.g., concurrently).

The opposite electrode 315 may be electrically connected to the electrode power-supply line 420 through a conductive layer 422 without directly contacting the electrode power-supply line 420. The planarization layer 140 may include an opening exposing the electrode power-supply line 420. In other words, the conductive layer 422 located on the planarization layer 140 may extend onto the electrode power-supply line 420 exposed by the opening (to thereby be electrically connected to the electrode power-supply line 420). Accordingly, the opposite electrode 315 may be in contact with the conductive layer 422 in the peripheral area PA, and the conductive layer 422 may be in contact with the electrode power-supply line 420 in the peripheral area PA.

The conductive layer 422 may be located on the planarization layer 140 and may be formed at the same time (e.g., concurrently) when a element (e.g., a conductive element) located on the planarization layer 140 in the display area DA is formed and of the same material as that of the element. In more detail, when the pixel electrode 311 in the display area DA is formed on the planarization layer 140, the conductive layer 422 may also be formed on the planarization layer 140 in the peripheral area PA by utilizing the same material as that of the pixel electrode 311. Accordingly, the conductive layer 422 may have the same structure as the pixel electrode 311. The conductive layer 422 may cover an exposed portion of the electrode power-supply line 420 (which is not covered by the planarization layer 140). Accordingly, the electrode power-supply line 420 may be prevented or substantially prevented from being damaged in a process of forming a first dam 610 or a second dam 620.

Also, the planarization layer 140 may have an opening 140b in the peripheral area PA to prevent or substantially prevent impurities (such as oxygen and/or moisture) from the outside from penetrating into the display area DA from the planarization layer 140. The conductive layer 422 and the opposite electrode 315 may completely cover the opening 140b. Accordingly, impurities that penetrated the planarization layer 140 in the peripheral area PA may be effectively prevented or substantially prevented from penetrating into the planarization layer 140 in the display area DA.

A second thin-film transistor TFT2 may be arranged in the peripheral area PA of the substrate 100. The second thin-film transistor TFT2 may be, for example, a portion of a built-in circuit unit (for example, a scan driver and/or the like) configured to control an electrical signal applied to the display area DA. The second thin-film transistor TFT2 may include a semiconductor layer 112, a gate electrode 114, a source electrode 116a, and a drain electrode 116b. The second thin-film transistor TFT2 may be formed in the same process as that of forming the first thin-film transistor TFT1. Accordingly, a detailed description of the second thin-film transistor TFT2 may not be repeated. In FIG. 6, the second thin-film transistor TFT2 may be between the opening 140b of the planarization layer 140 and the electrode power-supply line 420. However, the embodiments are not limited thereto, and the second thin-film transistor TFT2 may be between the display area DA and the opening 140b of the planarization layer 140.

A capping layer 160 may be arranged on the opposite electrode 315. The capping layer 160 may cover the opposite electrode 315 and may extend outside the opposite electrode 315 to make contact with the conductive layer 422 located below the opposite electrode 315. The capping layer 160 may cover the display area DA and extend to the peripheral area PA outside the display area DA. The capping layer 160 may include an organic material and/or at least one inorganic material selected from silicon oxide ($SiO_2$), silicon nitride ($SiN_x$), zinc oxide ($ZnO_2$), titanium oxide ($TiO_2$), zirconium oxide ($ZrO_2$), ITO, tris(8-hydroxyquinolinato)aluminum (Alq3), copper (II) phthalocyanine (CuPc), CBP, a-NPB, and zenite oxide ($ZiO_2$).

The capping layer 160 improves the efficiency of light generated in the organic light-emitting diode 310. For example, the capping layer 160 may enhance light extraction efficiency to the outside. It is preferable that the efficiency of the capping layer 160 is improved uniformly in the display area DA. Considering the above, it is preferable that the capping layer 160 has an upper surface corresponding to the curvature of an upper surface of a layer below the capping layer 160. In other words, the upper surface of the capping layer 160 located on the opposite electrode 315 may have a shape corresponding to the curvature of an upper surface of the opposite electrode 315.

An encapsulation layer 500 may be located above the capping layer 160. The encapsulation layer 500 protects the organic light-emitting diode 310 from moisture, oxygen, and/or the like from the outside. The encapsulation layer 500 may extend to the display area DA and the peripheral area PA. The encapsulation layer 500 may have a multilayer structure. The encapsulation layer 500 may include a first inorganic layer 510, an organic layer 520, and a second inorganic layer 530.

The first inorganic layer 510 may cover the capping layer 160 and may include silicon oxide, silicon nitride, silicon oxynitride, and/or the like. Because the first inorganic layer 510 is formed along an underlying structure, an upper surface of the first inorganic layer 510 may not be flat.

The organic layer 520 may cover the first inorganic layer 510 and have a sufficient thickness. An upper surface of the organic layer 520 may be substantially flat throughout the display area DA. The organic layer 520 may include one or more materials selected from PEN, PC, PI, polyethylene sulfonate (PES), polyoxymethylene (POM), PAR, and HMDSO.

The second inorganic layer 530 may cover the organic layer 520 and may include silicon oxide, silicon nitride, silicon oxynitride, and/or the like. The second inorganic layer 530 may extend outside the organic layer 520 to contact the first inorganic layer 510 to prevent or substantially prevent the organic layer 520 from being exposed to the outside.

As the encapsulation layer 500 is formed in a multilayer structure, even when a crack is generated in the encapsulation layer 500, the crack may be prevented or substantially prevented from being connected between the first inorganic layer 510 and the organic layer 520 or between the organic layer 520 and the second inorganic layer 530. Accordingly, a formation of a path through which water, oxygen, and/or the like from the outside penetrates into the display area DA may be prevented (or substantially prevented) or minimized.

Also, a structure below the encapsulation layer 500 may be damaged in a process of forming the encapsulation layer 500. For example, a layer directly below which the first inorganic layer 510 is formed may be damaged when the first inorganic layer 510 is formed. Accordingly, a protective layer 170 may be formed between the capping layer 160 and the encapsulation layer 500 to prevent or substantially prevent the capping layer 160 from being damaged in the process of forming the encapsulation layer 500. The protective layer 170 may include LiF. The protective layer 170 may extend outside the capping layer 160 to prevent or substantially prevent the capping layer 160 from being in direct contact with the encapsulation layer 500. In this case, the protective layer 170 may cover an end of the capping layer 160, and an end of the protective layer 170 may be located above the planarization layer 140. The end of the protective layer 170 may be in direct contact with the conductive layer above the planarization layer 140.

The first inorganic layer 510, which is the lowermost layer of the encapsulation layer 500, has a bonding strength with layers including an inorganic material greater than a bonding strength with layers including an organic material. Accordingly, when the capping layer 160 includes an organic material, a bonding strength between the protective layer 170 including an inorganic material such as LiF and the first inorganic layer 510 is greater than a bonding strength between the capping layer 160 and the first inorganic layer 510. Therefore, the encapsulation layer 500 may be maintained at a high bonding strength with a lower layer below the encapsulation layer 500. Accordingly, a peeling off of the encapsulation layer 500 from the lower layer during a manufacturing process or a utilization process after the manufacturing process may be effectively prevented (or substantially prevented) or minimized.

When the organic layer 520 is formed, a material utilized to form the organic layer 520 is required to be located in a set or predetermined area. To this end, the first dam 610 may be formed in the peripheral area PA as shown in FIG. 6. The first dam 610 may have a multilayer structure. The first dam 610 may include a first layer 611, a second layer 613, and a third layer 615 in a direction away from the substrate 100. The first layer 611 may be formed at the same time (e.g., concurrently) when the planarization layer 140 is formed and of the same material as that of the planarization layer. The second layer 613 may be formed at the same time (e.g., concurrently) when the pixel defining layer 150 is formed and of the same material as that of the pixel defining layer 150. The third layer 615 may include the same material as the pixel defining layer 150, or may be an organic material layer and/or an inorganic material layer (each formed by a separate process).

The second dam 620 may be between the first dam 610 and the opening 140b of the planarization layer 140. The second dam 620 may be located on the conductive layer 422 on the electrode power-supply line 420. The second dam 620 may have a multilayer structure and may include a number of layers less than that of the first dam 610 such that a height of the second dam 620 from the substrate 100 may be lower than that of the first dam 610. The second dam 620 may include a first layer 623 and a second layer 625. The first layer 623 may be formed of the same material as the pixel defining layer 150 and at the same time (e.g., concurrently) when the pixel defining layer 150 is formed. The second layer 625 may include the same material as the pixel defining layer 150, or may be an organic material layer and/or an inorganic material layer (each formed by a separate process).

The first inorganic layer 510 may cover the second dam 620 and the first dam 610 to be formed up to the outside of the first dam 610. The organic layer 520 on the first inorganic layer 510 may be limited in position by the second dam 620 such that a material utilized to form the organic layer 520 may be prevented or substantially prevented from overflowing over the second dam 620. Even when the material utilized to form the organic layer 520 partially overflows over the second dam 620, the position of the material of the organic layer 520 may be limited by the first dam 610 and the material utilized to form the organic layer 520 may be prevented or substantially prevented from moving in a direction towards the edge of the substrate 100.

A crack prevention dam 630 may be located in the peripheral area PA. The crack prevention dam 630 may extend along at least a portion of the edge of the substrate 100. For example, the crack prevention dam 630 may have a shape that extends completely around the display area DA. The crack prevention dam 630 may have a discontinuous shape in some portions of the peripheral area PA.

The crack prevention dam 630 may have various suitable shapes and may be simultaneously or concurrently formed by utilizing the same material as a portion of the elements formed in the display area DA or may have a multilayer structure. FIG. 6 illustrates that the crack prevention dam 630 has a structure including two layers. The crack prevention dam 630 may include a lower layer including the same material as the gate insulating layer 120 and an upper layer including the same material as the interlayer insulating layer 130 on the gate insulating layer 120. The crack prevention dam 630 may be located above the buffer layer 110. When needed, the crack prevention dam 630 may be located above a layer located below the buffer layer 110 and may include a layer including the same material as the buffer layer 110. The crack prevention dam 630 may include not one but a plurality of crack prevention dams 630 apart from each other.

The crack prevention dam 630 may be formed by removing portions of the gate insulating layer 120 and the interlayer insulating layer 130. In other words, as shown in FIG. 6, a transfer preventing groove 632 may be formed by removing the gate insulating layer 120 and the interlayer insulating layer 130 on at least one side of the crack prevention dam 630, and the crack prevention dam 630 may include a remaining portion of the gate insulating layer 120 and the interlayer insulating layer 130 adjacent to the transfer preventing groove 632.

The crack prevention dam 630 may be covered by a cover layer 650. The cover layer 650 may be formed of the same material as the planarization layer 140 and at the same time (e.g., concurrently) when the planarization layer 140 is formed. In other words, the cover layer 650 may be a layer including an organic material covering the crack prevention dam 630 (including an inorganic material). The cover layer 650 may fill the transfer preventing groove 632 and also cover the crack prevention dam 630.

FIGS. 7A to 7D are cross-sectional views of the display panel 10 taken along the line IV-IV' in FIG. 4, each according to a respective embodiment.

FIGS. 7A to 7D are cross-sectional views of some corner portions according to respective embodiments of the display panel 10.

Figure 7A:
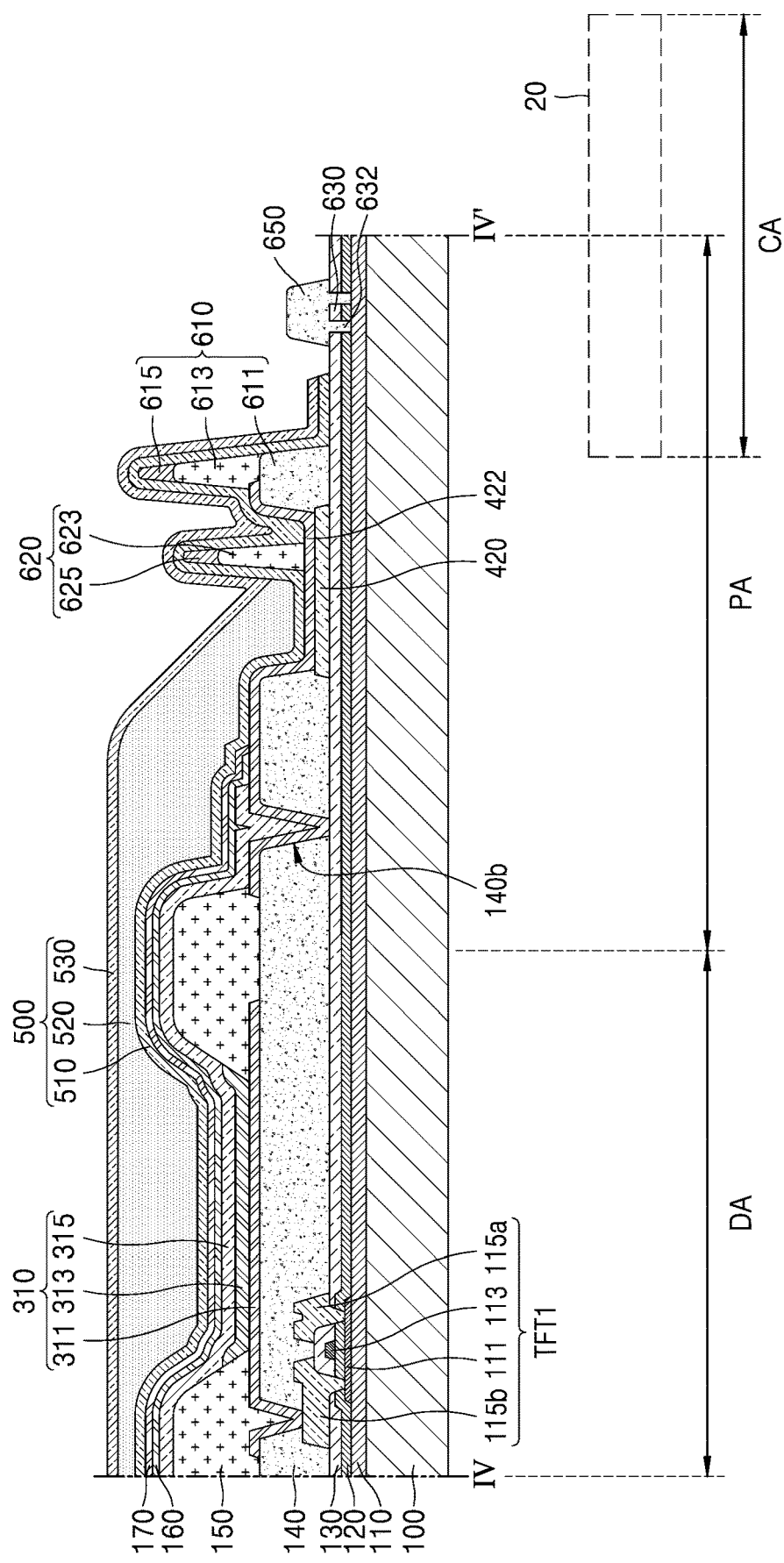
FIGS. 7A to 7D are cross-sectional views according to respective embodiments of a display panel taken along the line IV-IV' in FIG. 4.

FIG. 7A is a diagram illustrating a positional relationship between the display panel 10 and the component (e.g., module or accessory) 20 according to an embodiment shown in FIG. 3B. Referring to FIG. 7A, a portion of the component 20 may overlap the peripheral area PA of the display panel 10 and the rest of the component 20 may be located outside the peripheral area PA. The component area CA (where the component 20 locates) may overlap the first dam 610 and/or the second dam 620 in the peripheral area PA. The component area CA may not overlap the inside of the first dam 610 and the second dam 620. That is, the component area CA may not overlap the organic layer 520 of the encapsulation layer 500. The component area CA may overlap an end of the first inorganic layer 510 and the second inorganic layer 530 of the encapsulation layer 500. The component area CA may overlap the crack prevention dam 630. The opposite electrode 315 may not be arranged in the component area CA in the peripheral area PA.

Figure 7B:
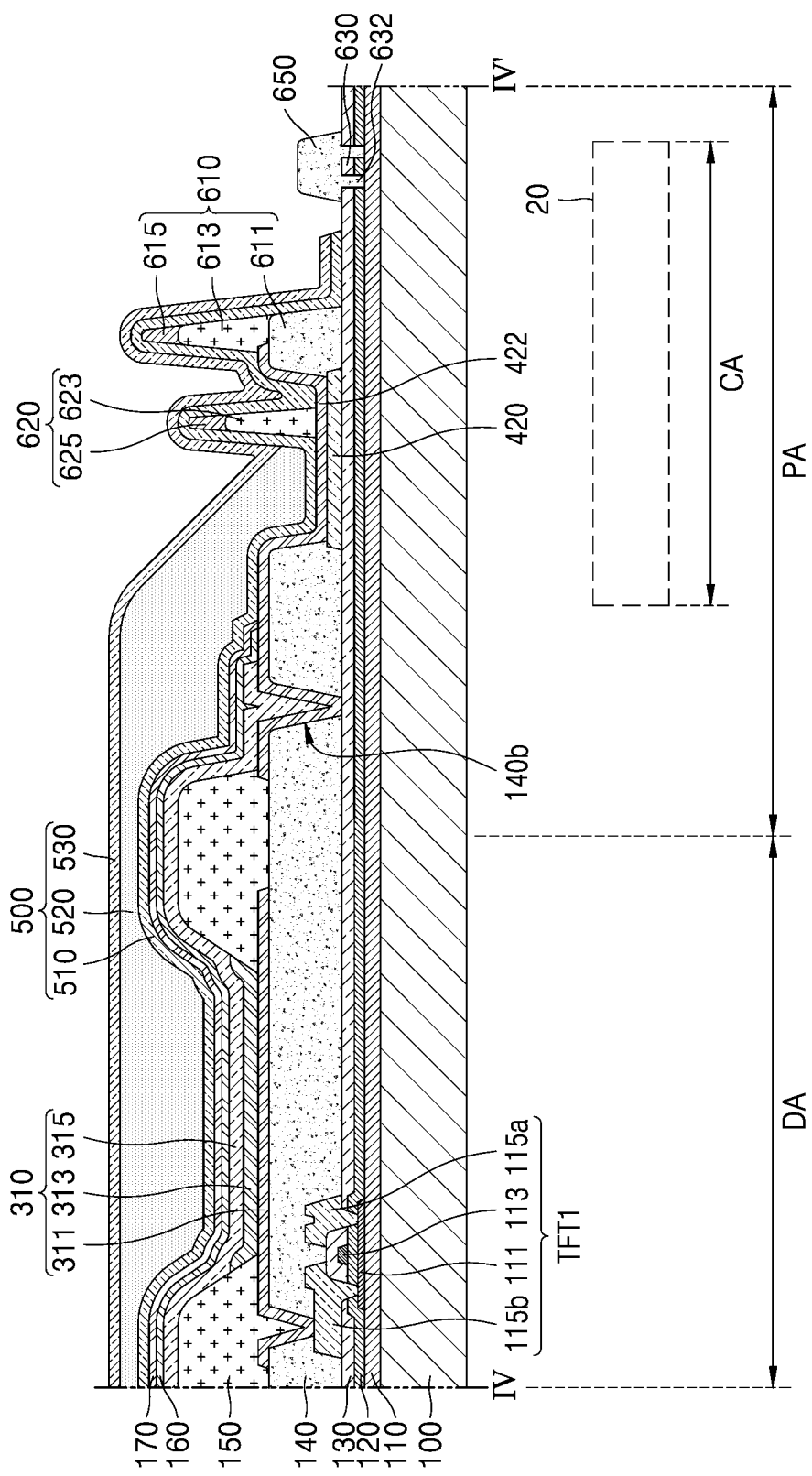
Figure 7C:
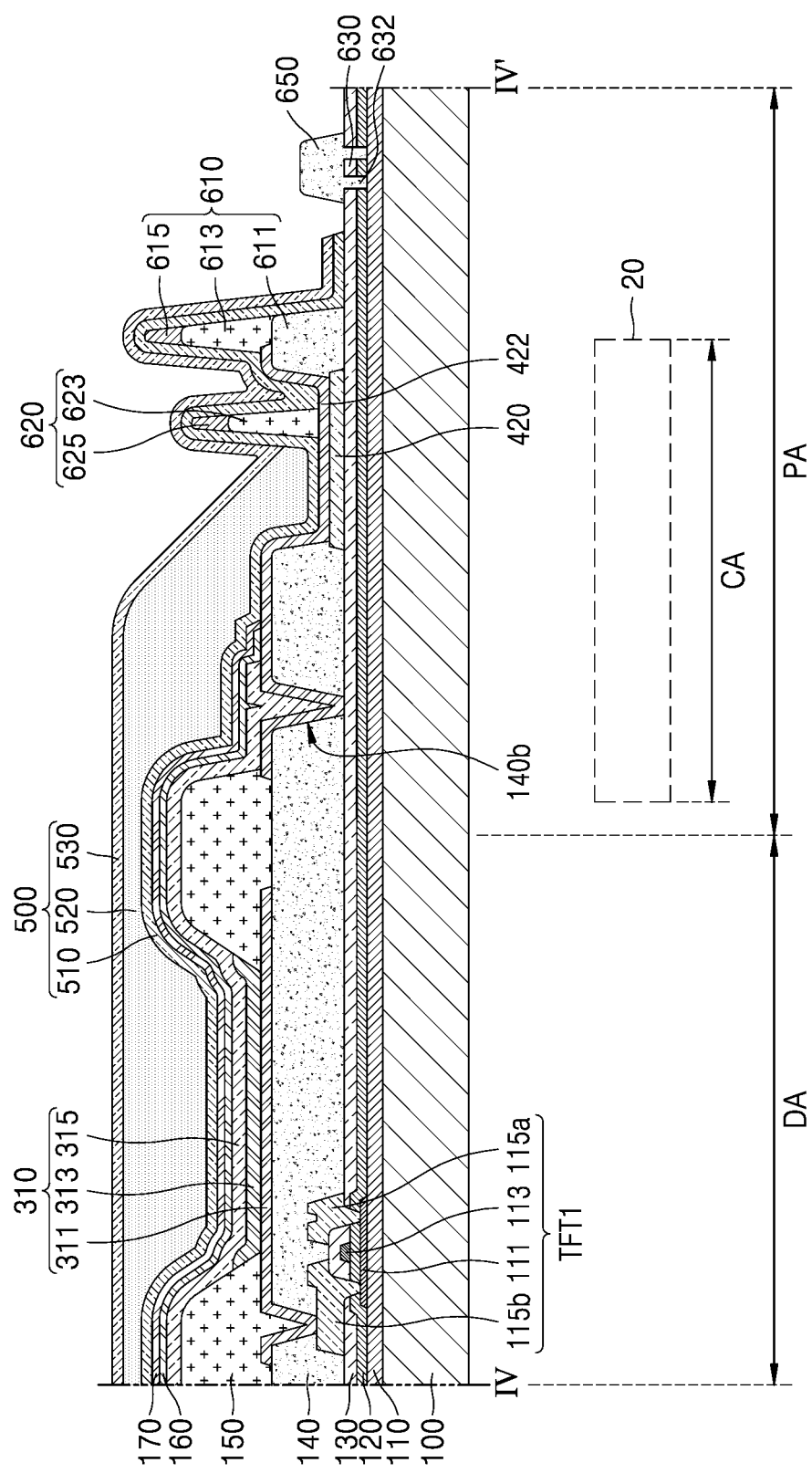
Figure 7D:
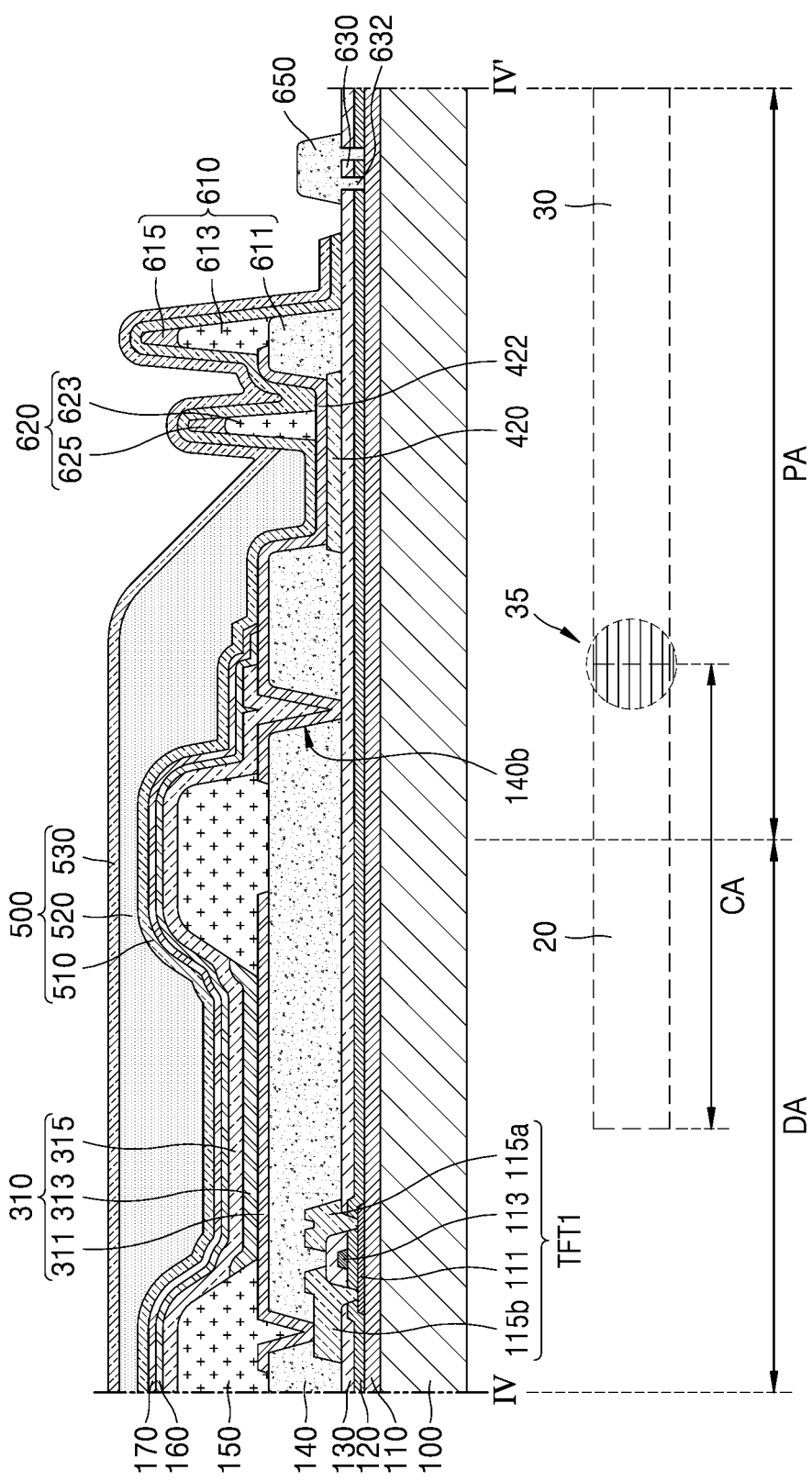

FIGS. 7B and 7C are diagrams each illustrating a positional relationship between the display panel 10 and the component 20 according to an embodiment shown in FIG. 3C. FIG. 7D is a diagram illustrating a positional relationship between the display panel 10 and the component 20 according to an embodiment shown in FIG. 3E.

Referring to FIG. 7B, the component 20 may overlap the peripheral area PA of the display panel 10. The component area CA may be located outside the opening 140b of the planarization layer 140. The component area CA may overlap the first dam 610 and/or the second dam 620 in the peripheral area PA. The component area CA may overlap the inside of the first dam 610 and the second dam 620. That is, the component area CA may overlap an end of the organic layer 520 of the encapsulation layer 500.

In FIG. 7B, the component 20 may overlap the electrode power-supply line 420 and the conductive layer 422. To secure the light transmittance that the component 20 requires, the widths (sizes) of the electrode power-supply line 420 and the conductive layer 422 in the component area CA may be less than that of the electrode power-supply line 420 and the conductive layer 422 in an area other than the component area CA. In another embodiment, the electrode power-supply line 420 and the conductive layer 422 may be arranged to bypass the component area CA. In this case, the electrode power-supply line 420 and the conductive layer 422 may not overlap the component area CA.

As shown in FIGS. 7A and 7B, the component area CA may be located in an area where the opposite electrode 315 is not arranged. However, when light transmittance of the component area CA is sufficient for the component 20 to operate, a portion of the component area CA may be included in the peripheral area PA, where the opposite electrode 315 is arranged, as shown in FIG. 7C.

Similarly, even when a portion of the component area CA is included in the display area DA of the display panel 10, when the light transmittance of the component area CA is sufficient for the component 20 to operate, a portion of the component area CA may be included in the display area DA of the display panel 10, as shown in FIG. 7D. The component area CA may be limited to the display area DA of the display panel 10 adjacent to the peripheral area PA. In more detail, the component area CA may overlap the pixel defining layer 150 in the display area DA and may not overlap the organic light-emitting diode 310 in the display area DA. In another embodiment, as shown in FIG. 7D, the component area CA may overlap a portion of the organic light-emitting diode 310 arranged in the display area DA.

When the light transmittance of the component area CA is not sufficient for the component 20 to operate as the component 20 is moved from the peripheral area PA to the display area DA due to a total size of a module including the component 20, the light-inducing member 30 connected to the component 20 may be included. The light-inducing member 30 may be included in the peripheral area PA and/or outside the peripheral area PA and may transfer sufficient light to the component 20. The light-inducing member 30 may include optical fiber 35 configured to transfer light between the component 20 and an exterior.

In the one or more embodiments, the component area CA may be located in the peripheral area PA of the display panel 10 and/or in the display area DA of the display panel 10 in a range in which the light transmittance required for the component 20 is secured to a proper level. The light transmittance may be secured by removing conductive wires arranged in the peripheral area PA and/or the display area DA of the display panel 10 (e.g., the opposite electrode 315, the electrode power-supply line 420, the conductive layer 422, and/or the like), changing a width (size) and/or a location of the conductive wires, and/or adjusting a thickness of insulating layers (such as the buffer layer 110, the gate insulating layer 120, the interlayer insulating layer 130, the planarization layer 140, and/or the pixel defining layer 150), and/or removing some of the insulating layers. Alternatively, the light-inducing member 30 may be utilized.

In the above-described embodiments, the component 20 is described as being located in the peripheral area PA formed at the corner of the display panel 10.

The embodiments are not limited thereto. For example, the component 20 may be located in the peripheral area PA of the four sides of the display panel 10 shown in FIG. 6. In this case, the component 20 may overlap a portion of the built-in circuit unit, and to secure the light transmittance of the component area CA, the design may be changed such that some elements and/or wires of the built-in circuit unit bypass the component area CA, a size (such as the width) of the elements and/or wires may be reduced, and/or the elements and/or wires may be removed.

FIGS. 8A to 8F are plan views of examples of a mask 200 configured to form the opposite electrode 315 of the display panel 10.

Referring to FIGS. 8A to 8F, the mask 200 may include an opening portion 210 and a shielding portion 230. The opening portion 210 may correspond to a shape of the display panel 10 and may have a size corresponding to a portion of the display area DA and the peripheral area PA of the substrate 100. A material of forming the opposite electrode 315 may be coated on an upper portion of the substrate 100 through the opening portion 210. The shielding portion 230 may correspond to a portion of the peripheral area PA and a component area CA' of the substrate 100. Accordingly, the opposite electrode 315 may not be formed in a portion of the peripheral area PA and the component area CA' of the substrate 100 that are covered by the shielding portion 230. Therefore, a process of removing the opposite electrode 315 arranged in the component area CA' may not be added such that a manufacturing cost of the display panel 10 is not increased.

Figure 8A:
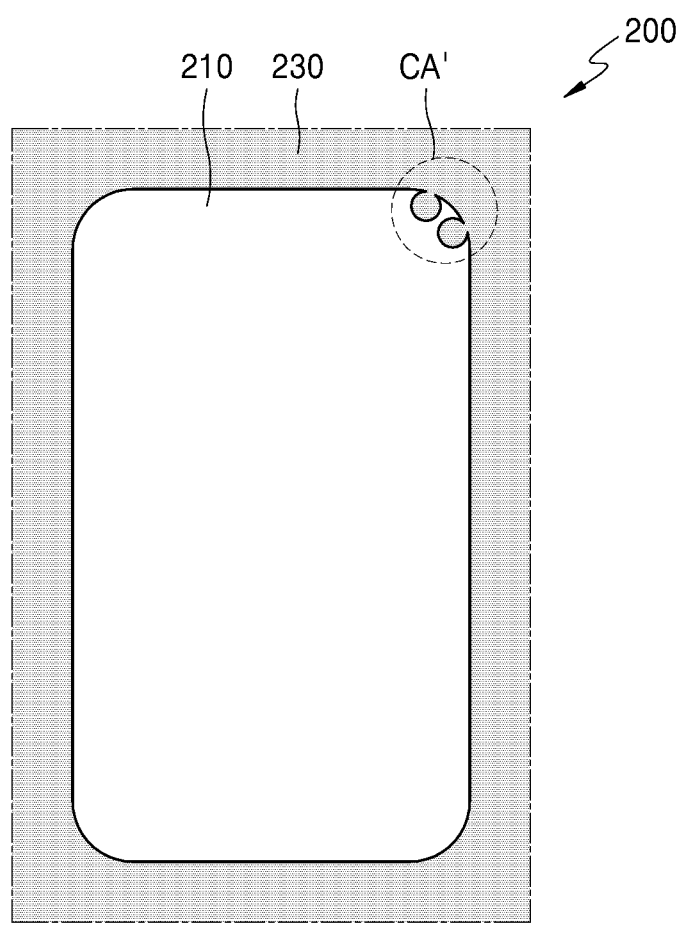
FIGS. 8A to 8F are plan views of examples of a mask configured to form an opposite electrode of a display panel.
Figure 8B:
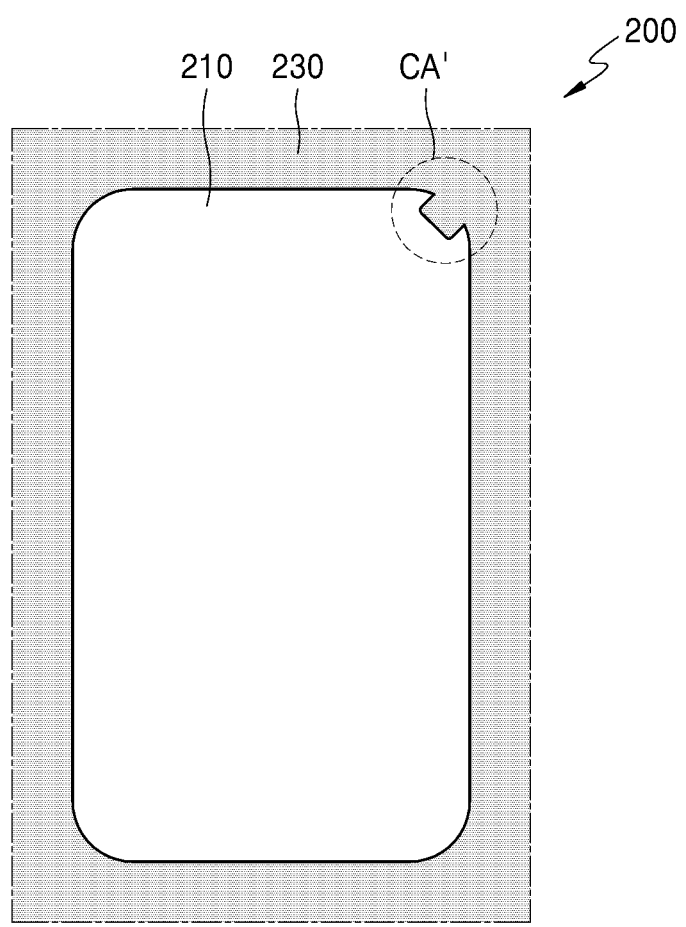
Figure 8C:
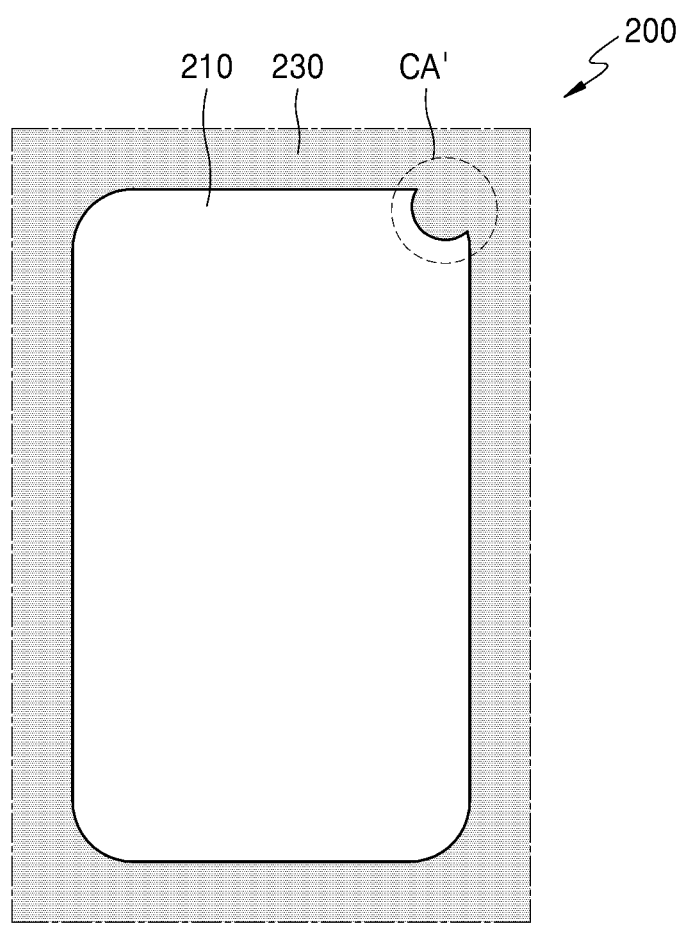
Figure 8D:
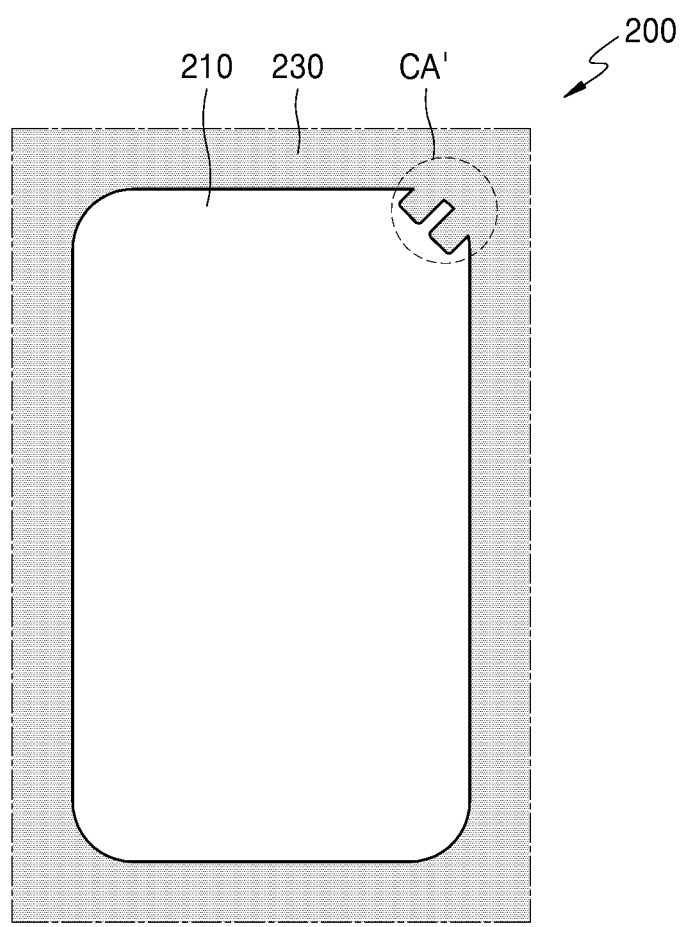
Figure 8E:
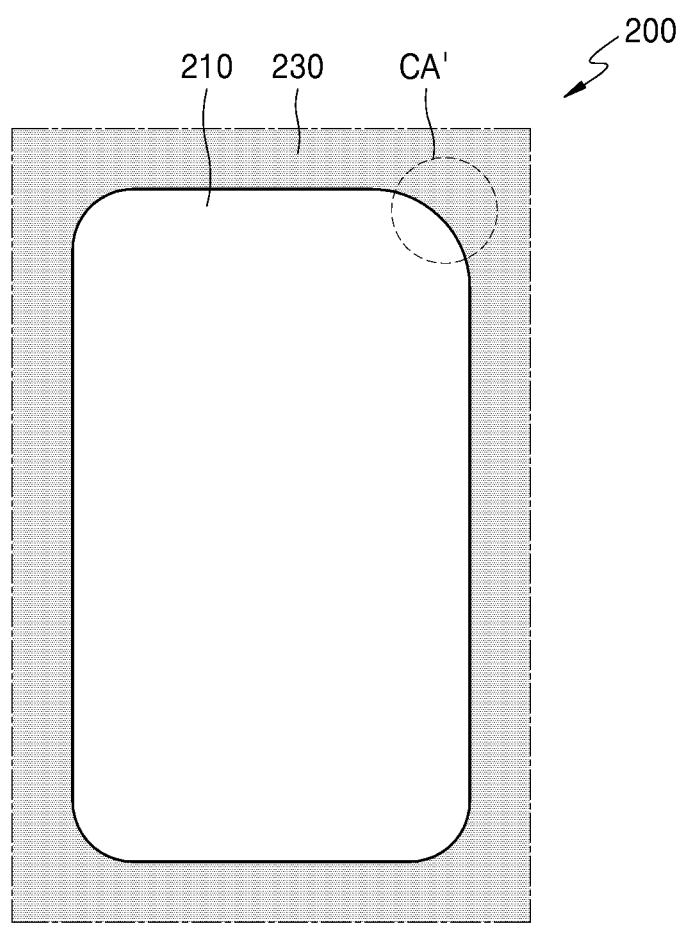
Figure 8F:
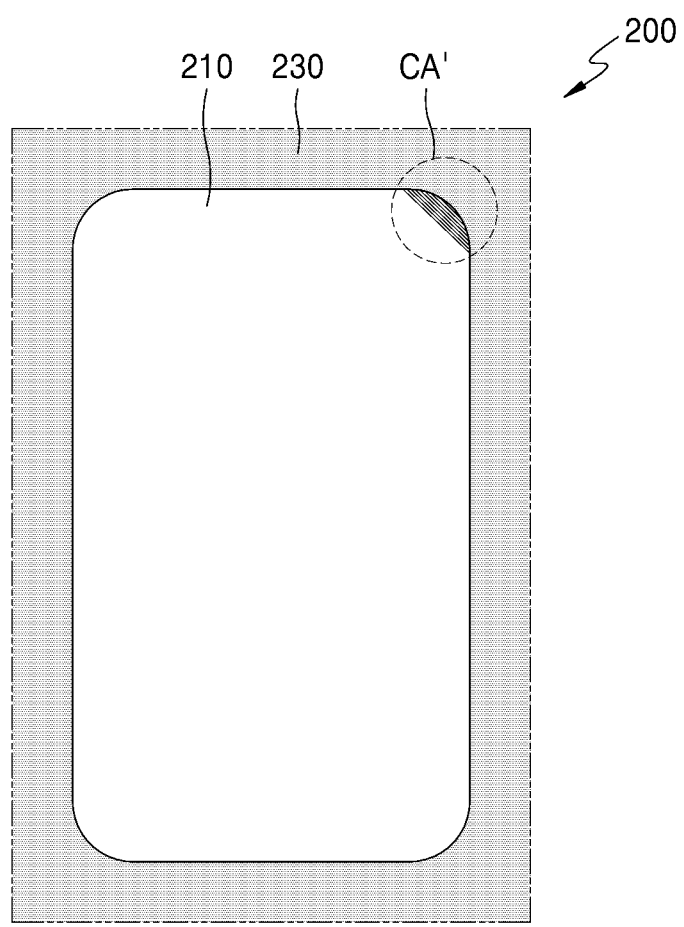

The component area CA' may be located at a corner of the display panel 10. The component area CA' may include one area or more than one area. The component area CA' may have various suitable shapes and sizes such as a circle (FIG. 8A), a rectangle (FIGS. 8B and 8D), a semicircle (FIG. 8C), a crescent (FIG. 8E), and a plurality of straight lines (FIG. 8F). As described above, the component area CA' may be located on four sides of the display panel 10 besides the corner of the display panel 10. In this case, the shielding portion 230 of the mask 200 configured to form the opposite electrode 315 may include an area corresponding to the component area CA' of four sides in addition to the corner of the display panel 10.

Figure 9:
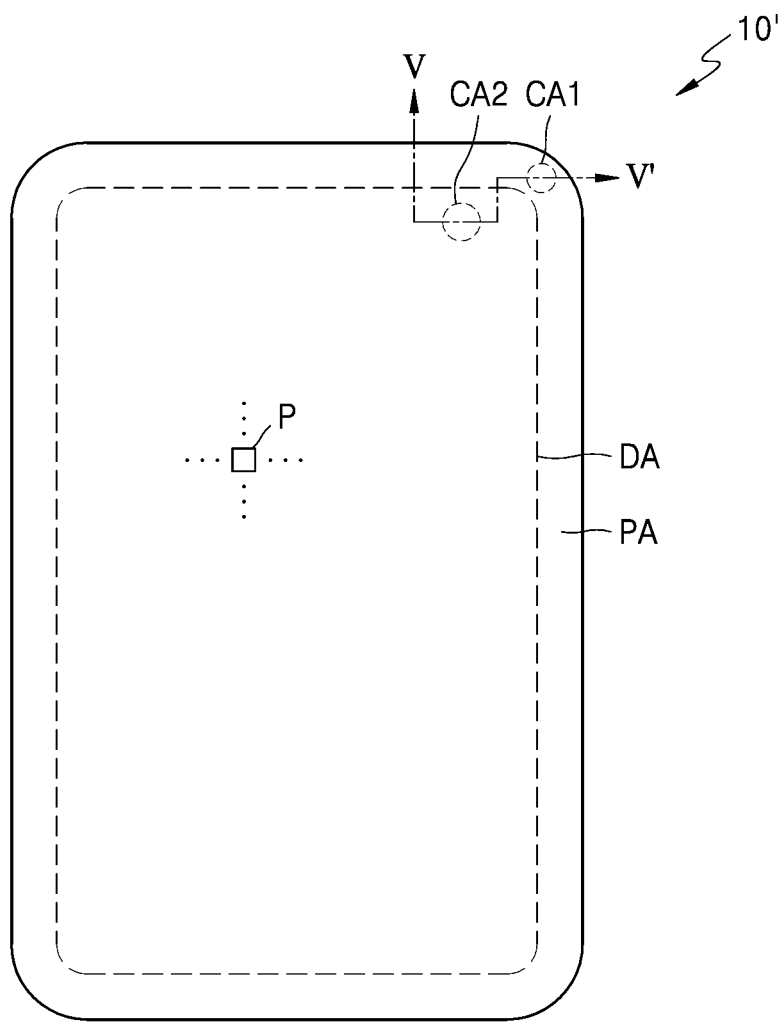
FIG. 9 is a schematic plan view of a display panel according to another embodiment.
Figure 10:
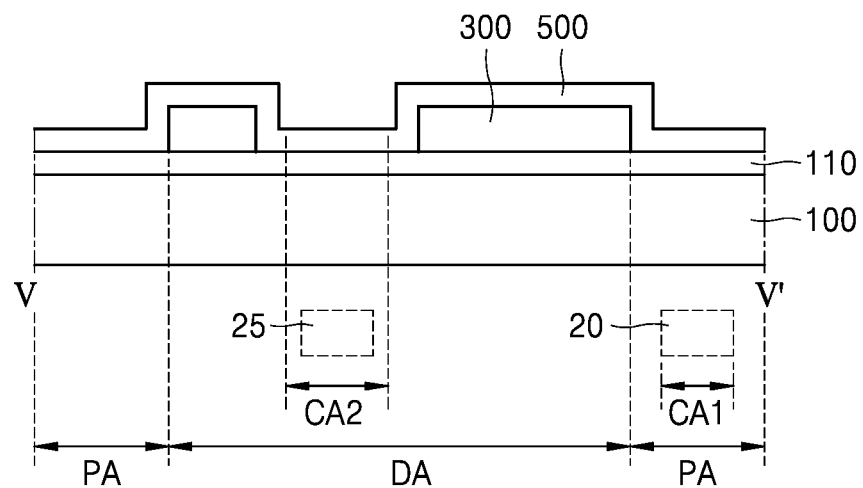
FIGS. 10 and 11 are schematic cross-sectional views according to respective embodiments of a portion of a display panel taken along the line V-V in FIG. 9.
Figure 11:
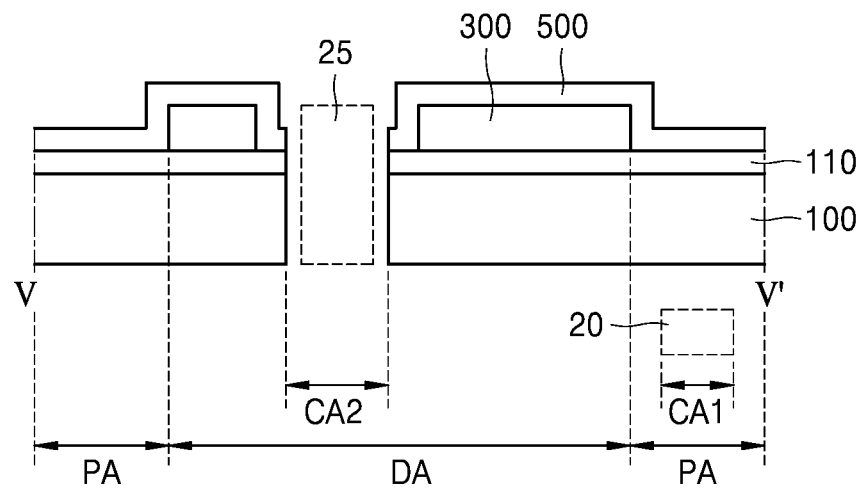

FIG. 9 is a schematic plan view of a display panel 10' according to another embodiment. FIGS. 10 and 11 are schematic cross-sectional views according to respective embodiments of a portion of a display panel 10' taken along the line V-V' in FIG. 9.

Referring to FIG. 9, the display panel 10' according to an embodiment may include the display area DA and the peripheral area PA outside the display area DA. The display panel 10' may include a first component area CA1 included in the peripheral area PA and a second component area CA2 included inside the display area DA. The display panel 10' shown in FIG. 9 may be a view of a substrate 100. For example, the substrate 100 may include the display area DA and the peripheral area PA, and the first component area CA1 and the second component area CA2.

The display panel 10' includes a plurality of pixels P arranged in the display area DA. The pixel P may include a pixel circuit described above with reference to FIG. 5. The peripheral area PA may be an area where the pixels are not arranged.

Referring to FIG. 10, the display panel 10' may include a display layer 300 located above the substrate 100. The substrate 100 may include a glass material and/or a polymer resin. The substrate 100 may include multiple layers. For example, as shown in an enlarged view of FIG. 6, the substrate 100 may include a first base layer 101, a first barrier layer 102, a second base layer 103, and a second barrier layer 104.

The display layer 300 has the plurality of pixels P. The display layer may include display elements arranged for each pixel P and a pixel circuit and insulating layers arranged for each pixel P. The pixel circuit may include a transistor and a capacitor, and the display element may include an organic light-emitting diode (OLED). A buffer layer 110 may be included between the substrate 100 and the display layer 300. The display layer 300 may be covered by an encapsulation member such as the encapsulation layer 500, and the encapsulation layer 500 may include at least one inorganic layer and at least one organic layer. When the display panel 10' includes the substrate 100 including a polymer resin and the encapsulation layer 500 including the inorganic layer and the organic layer, the flexibility of the display panel 10' may be improved.

The display panel 10' may include the first component area CA1 inside the peripheral area PA and the second component area CA2 inside the display area DA. The display layer 300 corresponding to the second component area CA2 may be removed. The substrate 100 corresponding to the second component area CA2 may not be removed. A first component 20 may be arranged below the display panel 10' in accordance with the first component area CA1. A second component 25 may be arranged below the display panel 10' in accordance with the second component area CA2.

In another embodiment, as shown in FIG. 11, the display panel 10' may include an opening passing through the display panel 10' in the second component area CA2. The second component 25 may be located inside the opening of the second component area CA2. The first component 20 may be arranged below the display panel 10' in accordance with the first component area CA1.

When a sensor is arranged in a display area of a display device, a full screen display may be hindered (e.g., disrupted) and aesthetics may be degraded (due to sensor-related resolution degradation, a patterning of an opposite electrode in a corresponding area and visibility of the opposite electrode patterns). According to the one or more embodiments, a component is arranged in a non-display area of a window and an edge of a display area of a display panel, that is, an area from an end of the window to a portion of the display area adjacent to a peripheral area of the display panel. Thus, compared with a display device in which a component is arranged in a display area of a display panel, according to a display device of the present disclosure, an entire dead space and effective dead space may be reduced while ensuring the largest display area without physical deformation of the display panel. In addition, as a pattern of the opposite electrode around the component is not visually recognized, the screen uniformity and aesthetics are not reduced.

According to one or more embodiments, a display device has excellent screen uniformity and aesthetics while ensuring the largest display area in a display panel (including an area where various suitable types of components (e.g., various suitable modules or accessories) are arranged). However, the effects are illustrative and effects according to the embodiments are described in more detail through the description.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, the use of "may" when describing embodiments of the present invention refers to "one or more embodiments of the present invention."

The display device and/or any other relevant devices or elements according to embodiments of the present invention described herein may be implemented utilizing any suitable hardware, firmware (e.g. an application-specific integrated circuit), software, or a combination of software, firmware, and hardware. For example, the various elements of the display device may be formed on one integrated circuit (IC) chip or on separate IC chips. Further, the various elements of the display device may be implemented on a flexible printed circuit film, a tape carrier package (TCP), a printed circuit board (PCB), or formed on one substrate. Further, the various elements of the display device may be a process or thread, running on one or more processors, in one or more computing devices, executing computer program instructions and interacting with other system elements for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It may be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display device comprising:
   a window;
   a display panel below the window, comprising a substrate and comprising a display area and a peripheral area outside the display area; and
   a component below the substrate of the display panel and at least partially overlapping the peripheral area,
   wherein a black matrix is on a bottom surface of the window in correspondence with an area other than an area where the component is located in the peripheral area, and
   wherein the substrate comprises multiple layers.

2. The display device of claim 1, wherein the component overlaps the peripheral area in a corner of the display panel.

3. The display device of claim 1, wherein the window comprises an extended portion extending outside the peripheral area of the display panel, and
   at least a portion of the component overlaps the extended portion of the window.

4. The display device of claim 1, wherein, in the peripheral area of the display panel, a first area where the component is located is different in light transmittance from that of a second area outside the first area.

5. A display device comprising:
   a window;
   a display panel below the window, comprising a substrate and comprising a display area and a peripheral area outside the display area; and
   a component below the substrate of the display panel and at least partially overlapping the peripheral area,
   wherein a black matrix is on a bottom surface of the window in correspondence with an area other than an area where the component is located in the peripheral area,
   wherein the display panel comprises:
   the substrate;
   an insulating layer above the substrate in the display area and the peripheral area, the insulating layer having a first opening in the peripheral area;
   a pixel electrode above the insulating layer in the display area;
   a first conductive layer above the insulating layer in the peripheral area and covering the first opening;
   an intermediate layer on the pixel electrode; and
   an opposite electrode covering the intermediate layer and contacting the first conductive layer.

6. The display device of claim 5, wherein the component does not overlap the opposite electrode in the peripheral area.

7. The display device of claim 5, wherein the component at least partially overlaps the opposite electrode in the peripheral area.

8. The display device of claim 5, wherein the display panel further comprises a second conductive layer in the peripheral area, outside the first opening, and below the insulating layer,
   wherein the insulating layer comprises a second opening exposing the second conductive layer, and
   the first conductive layer contacts the second conductive layer in the second opening.

9. The display device of claim 8, wherein the display panel further comprises a dam above the second conductive layer.

10. The display panel of claim 9, wherein the component at least partially overlaps the dam.

11. The display device of claim 9, wherein the display panel further comprises an encapsulation layer covering the display area and comprising at least one organic layer and at least one inorganic layer.

12. The display device of claim 11, wherein the at least one organic layer of the encapsulation layer is inside the dam, and
   the at least one inorganic layer of the encapsulation layer extends outside of the dam.

13. The display device of claim 12, wherein the component does not overlap the at least one organic layer of the encapsulation layer and overlaps the at least one inorganic layer of the encapsulation layer.

14. The display device of claim 12, wherein the component overlaps the at least one organic layer and the at least one inorganic layer.

15. A display device comprising:
   a window;
   a display panel below the window, comprising a substrate and comprising a display area and a peripheral area around the display area; and
   a component below the substrate of the display panel and at least partially overlapping the display area,
   wherein a black matrix is on a bottom surface of the window in correspondence with an area other than an area where the component is located in the peripheral area.

16. The display device of claim 15, further comprising a light-inducing member at least partially overlapping the peripheral area and to guide external light penetrating the peripheral area to the component.

17. The display device of claim 16, wherein the light-inducing member comprises an optical fiber.

18. The display device of claim 15, wherein the display panel comprises
   the substrate;
   an insulating layer above the substrate in the display area and the peripheral area, the insulating layer having a first opening in the peripheral area;
   a display element above the insulating layer in the display area and comprising a pixel electrode, an intermediate layer, and an opposite electrode; and
   a first conductive layer above the insulating layer in the peripheral area and covering the first opening,
   wherein the opposite electrode extends to the peripheral area and contacts the first conductive layer.

19. The display device of claim 18, wherein the component at least partially overlaps the first opening in the peripheral area.

20. The display device of claim 18, wherein the component does not overlap the display element in the display area.

* * * * *